(12) United States Patent
Tschirhart et al.

(10) Patent No.: US 11,474,547 B2
(45) Date of Patent: Oct. 18, 2022

(54) APPARATUS AND METHOD OF BALANCING INPUT POWER FROM MULTIPLE SOURCES

(71) Applicant: Intel Corporation, Santa Clara, CA (US)

(72) Inventors: Darryl Tschirhart, Newmarket (CA); Alan Wu, Toronto (CA); Jason Lee Pack, North York (CA); Yvan Large, Richmond Hill (CA); Sanjeev Jahagirdar, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 222 days.

(21) Appl. No.: 16/792,073

(22) Filed: Feb. 14, 2020

(65) Prior Publication Data

US 2021/0255650 A1 Aug. 19, 2021

(51) Int. Cl.
*H03M 1/34* (2006.01)
*G05F 1/565* (2006.01)
*H02J 1/10* (2006.01)
*G05F 1/575* (2006.01)
*G06F 1/28* (2006.01)

(52) U.S. Cl.
CPC .............. *G05F 1/565* (2013.01); *G05F 1/575* (2013.01); *G06F 1/28* (2013.01); *H02J 1/106* (2020.01); *H03M 1/34* (2013.01)

(58) Field of Classification Search
None
See application file for complete search history.

(56) References Cited

U.S. PATENT DOCUMENTS

| | | | |
|---|---|---|---|
| 5,814,972 A * | 9/1998 | Shimada | H02J 9/061 320/132 |
| 6,177,783 B1 | 1/2001 | Donohue | |
| 6,215,290 B1 | 4/2001 | Yang et al. | |
| 7,498,694 B2 * | 3/2009 | Luo | H02M 1/10 307/82 |
| 8,856,557 B2 | 10/2014 | DiMarco et al. | |
| 9,100,757 B2 * | 8/2015 | Johnson | H04R 29/001 |
| 9,553,449 B2 * | 1/2017 | Tajiri | H02J 1/00 |
| 10,027,135 B2 * | 7/2018 | Shen | H02J 7/0019 |
| 10,069,414 B2 | 9/2018 | Sen et al. | |
| 10,218,355 B2 * | 2/2019 | Ikenaga | H03K 17/693 |
| 10,270,262 B2 * | 4/2019 | Kim | H02J 7/0026 |
| 10,311,253 B2 * | 6/2019 | Eppensteiner | G06F 21/71 |
| 10,889,190 B2 * | 1/2021 | Koh | B60L 53/20 |
| 11,152,860 B2 * | 10/2021 | Lee | H02M 3/1584 |

(Continued)

*Primary Examiner* — Thomas J. Hiltunen
(74) *Attorney, Agent, or Firm* — Schwabe, Williamson & Wyatt, P.C.

(57) ABSTRACT

A scheme is provided for dynamically adjusting an amount of power drawn from individual power sources to optimize the power usage without violating power limits. Coarse adjustment is provided through dynamic phase reallocation while a fine adjustment is provided through dynamic current steering. By adding a control loop around current steering techniques in digital voltage regulator controllers, power drawn from multiple input rails is balanced. The apparatus allows users to maximize the power delivered to discrete graphics cards without violating PCIe specifications. This allows maximum performance with minimal bill-of-material (BOM) cost.

24 Claims, 16 Drawing Sheets

(56) References Cited

U.S. PATENT DOCUMENTS

| | | | |
|---|---|---|---|
| 2013/0038289 A1* | 2/2013 | Tse | H02M 3/1584 |
| | | | 320/118 |
| 2015/0002095 A1* | 1/2015 | Wada | B60L 58/22 |
| | | | 320/112 |
| 2021/0257841 A1* | 8/2021 | Lee | H02J 7/0016 |

* cited by examiner though the power is supplied at 12V; hence requiring
APPARATUS AND METHOD OF BALANCING INPUT POWER FROM MULTIPLE SOURCES

BACKGROUND

Mid- to high-end discrete graphics cards used in computer systems draw power from the PCIe (peripheral component interconnect express) slot and one or more external connectors from a silver box. A graphical processing unit (GPU) requires multiple low voltages for proper operation. The power to the GPU is supplied at 12V; hence requiring switching power supplies known as voltage regulators (VRs) to provide the voltage conversion from 12V to the lower voltages required by the GPU. Industry-standard PCIe specification limits the allowable power (and current) drawn from each source (connector). Therefore, to achieve maximum performance of the GPU, the GPU is to draw maximum power from all sources. This is only possible if the power drawn is balanced among connectors providing the power supply.

Typically, there is no dynamic balance mechanism to balance the input power supply to various regulators. Some level of input power balance is achieved passively through card design by selectively feeding different VRs, or phases of high-current VRs from appropriate sources. For example, different voltage rails and/or phases are passively or statically distributed among the various input power sources.

Passive power balancing is the least flexible option. It is a static configuration where the level of input power balance depends on discrete power levels of different VRs and each phase of the core rail. In this case, the GPU performance is limited to prevent overpower conditions on any of the sources. For example, it is possible that the most achievable balance results in one source drawing maximum power while the other draws 15% less. That 15% is left on the table and not realized as GPU performance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
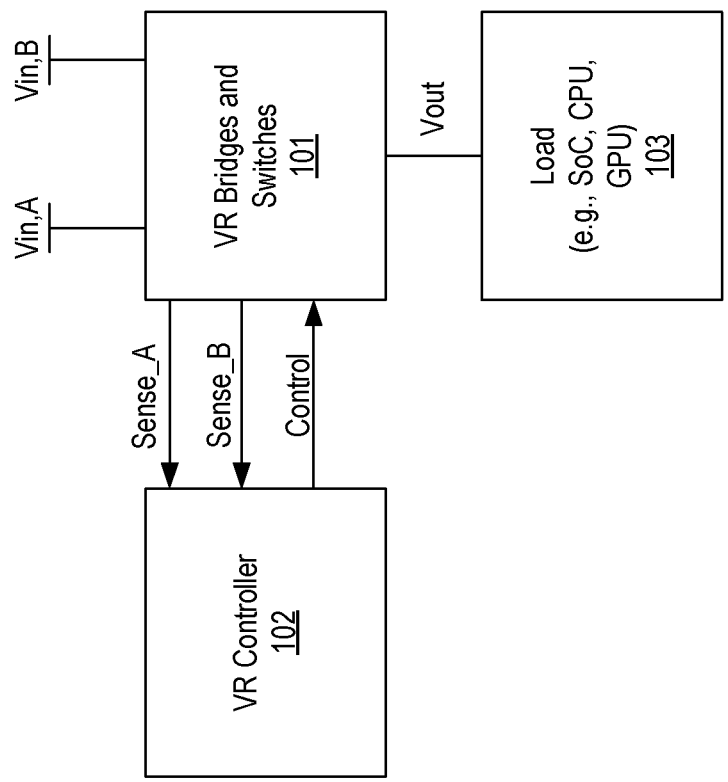
FIG. 1 illustrates a high-level usage architecture of apparatus of balancing input power from multiple sources, in accordance with some embodiments.

Some embodiments provide apparatus and schemes of dynamically adjusting an amount of power drawn from individual input power sources to optimize the power usage without violating power limits. In some embodiments, a coarse adjustment to input power allocation is provided through dynamic phase reallocation. For example, one or more switches, coupled to voltage regulation bridges and input power supply rails, are dynamically controlled to move one or more phases (associated with corresponding one or more bridges) from one input supply rail to another input supply rail. In on example, the one or more switches move a phase from a first set of bridges to a second set of bridges if the second set of bridges demands less power than the first (e.g., more power headroom on the second power rail). In some embodiments, controller adjusts a duty cycle of a drive signal to each bridge of the first and/or second set of bridges to introduce current inequality between the bridges. In some embodiments, the current inequality between the first and second set of bridges is introduced in response to measured input power. In some embodiments, the current inequality between the first and second set of bridges is introduced in response to measured input current.

Here, the term "dynamically" generally refers to an automatic action by a controller that may not need physical redesign of a system while the system is operating. Conversely, the term "statically" generally refers to a passive action that requires a system to stop operating to make a physical change to the system. In some embodiments, a fine adjustment to input power allocation is done through dynamic current steering within the one or more bridges. For example, by adding a control loop around current steering techniques available in digital voltage regulator controllers, power drawn from multiple input rails can be balanced, or to approach parity.

There are many technical effects of various embodiments. For example, the apparatus and method described allows users to dynamically maximize the power delivered to discrete processors (e.g., graphics processing units on graphics cards) without violating PCIe specifications. This allows maximum performance with minimal bill-of-material (BOM) cost. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, power signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and Fin Field Effect Transsitors (FETs), Gate All Around Cylindrical Transistors, Tunneling FET (TFET), Square Wire, Rectangular Ribbon Transistors, ferroelectric FET (FeFETs), vertical MOSFETs, or other devices implementing transistor functionality like carbon nanotubes or spintronic devices. In vertical MOSFETs, drain and source terminals are not symmetrical. For typical MOSFET source and drain terminals are symmetrical i.e., are identical terminals, and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a high-level usage architecture of apparatus 100 of balancing input power from multiple sources, in accordance with some embodiments. Apparatus 100 comprises input power supply rails, voltage regulator (VR) bridges and switches 101, VR controller 102, and load 103. The VR bridges provide regulated power supply Vout to load 103. Load 103 may have its own VRs to regulate power to various logic domains inside load 103. The VRs of load 103 may use Vout as its input power supply. Input power supply rails provide input power supply to the VR bridges from same or different power supply sources. The power supply sources may be an AC-DC converter or a DC-DC converter that provides, for example, 12 V DC power supply to the input power supply rails. The power supply sources may be coupled to the apparatus via one or more connectors on a board. Here, two input supply rails Vin,A and Vin,B are illustrated that may receive power supplies from two different sources. However, any number of input supply rails can be used to provide power to multiple bridges of a voltage regulator (VR).

As discussed in the background section, various relevant specifications (e.g., PCIe specification) limit the allowable power (and current) drawn from each power supply source via the connector. Therefore, to achieve maximum performance of load 103, load 103 is to draw maximum power from all input power supply sources. This is only possible if the power drawn is balanced among connectors providing the power supply. Typically, there is no dynamic balance mechanism to balance the input power supply to various regulators. Some level of input power balance is achieved passively through card design by selectively feeding different VRs, phases or bridges of high-current VRs from appropriate input power supply sources. For example, different voltage rails and/or phases are passively or statically distributed among the various input power sources.

In various embodiments, VR controller 102 senses, measures, and/or estimates (indicated by Sense_A and Sense_B), the current through each power supply rail, voltage of each power supply rail, and/or power of each power supply rail. VR controller 102 processes the sensed, measured, and/or estimated values and generates one or more control signals to turn on/off switches that couple or decouple one or more phases (or bridges) from one input power supply rail to another input power supply rail. The logic values of the one or more control signals depends on the power limit that can be drawn from the input power supply rails. These values are sensed, measured, and/or estimated values and indicate the imbalance in the amount of power drawn from the input power supply rails. One goal of VR controller 102 is to balance power draw from the various input power supplies (provided on input power supply rails) so that load 103 can operate with maximum power and performance it needs to perform its tasks. Load 103 can be any suitable load such as a system-on-chip as discussed with reference to FIG. 16, a general purpose processor (CPU), a graphics processing unit (GPU), an application specific integrated circuit (ASIC), artificial intelligence processor, an inference chip, a digital signal processor (DSP), etc.

In some embodiments, VR bridges and switches 101 and/or VR controller 102 are on-board components. In some embodiments, VR bridges and switches 101 and/or VR controller 102 are on a single die. In some embodiments, VR bridges and switches 101 and/or VR controller 102 are within SoC/load 103.

Figure 2:
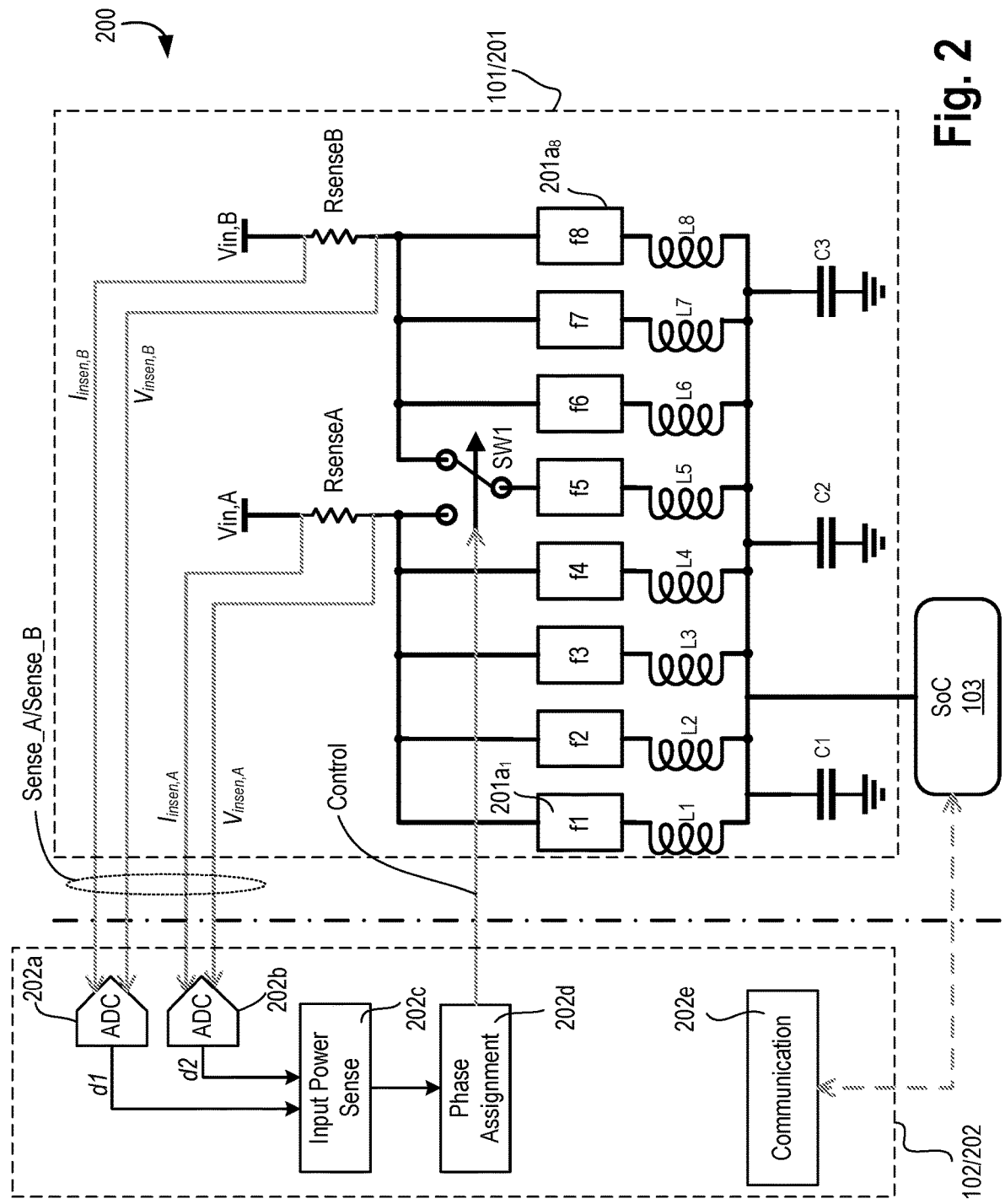
FIG. 2 illustrates an apparatus where a voltage regulator controller measures two input power sources and sends a control signal to a switch for balancing input power from multiple sources, in accordance with some embodiments.

FIG. 2 illustrates apparatus 200 where a voltage regulator controller measures two input power sources and sends a control signal to a switch for balancing input power from multiple sources, in accordance with some embodiments. In some embodiments, VR bridge block 201/101 comprises a plurality of bridges or phases $201a_{1-N}$ (where N=8 in this example, but can be any number), plurality of inductors (e.g., L1 though L8, but can be any number depending on the number of bridges), load capacitors (e.g., C1 though C3, but can be any number needed for performance requirements such as stability, transient voltage response, etc.), and sensing resistors (e.g., RsenseA and RsenseB). In most cases, the number of capacitors are determined by overshoot requirements during load release. Each bridge may comprise a high-side switch and a low-side switch coupled in series with the high-side switch. The high-side switch is further coupled to the power supply rail. In this example, a first set of bridges f1, f2, f3, and f4 are coupled to a first power supply rail Vin,A while a second set of bridges f5, f6, f7, and f8 are coupled to a second power supply rail Vin,B.

VR bridge 201/101 also comprises switch SW1 that is controllable by Control signal from VR controller 102/202. Switch SW1 couples bridge f5 to the first power supply rail Vin,A or to the second power supply rail Vin,B. Switch SW1 is implemented as a transistor that can be any high voltage transistor of any conductivity type. For example, switch SW1 is an n-type transistor, p-type transistor, or a combination of n-type and p-type transistors. By having the ability to control the switch SW1 and thus move a phase (e.g., bridge f5) from a first input supply rail to a second input supply rail, or the other way around, allows for balancing the power draw from the first and/or second power supply rails. Switch SW1 behaves like a power multiplexer and connects one of the input power sources to one or more phases based on the control signal. In various embodiments, control signal is a digital signal.

In some embodiments, VR controller 102/202 comprises analog-to-digital converters (ADCs) 202a and 202b, input power sense circuitry 202c, phase assignment circuitry 202d, and communication interface 202e. Here, two ADCs are shown. However, the number of ADCs depend on the number of power supply rails and their sense signals. ADCs 202a and 202b are apparatuses that convert continuous physical quantities (e.g., voltages) to digital numbers that represent the amplitude of the physical quantities. In some embodiments, ADCs 202a and 202b convert the analog signals Sense_A (e.g., voltage $V_{insen,A}$ and current $I_{insen,A}$) and Sense_B (e.g., voltage $V_{insen,B}$ and current $V_{insen,B}$) to their corresponding digital representations d1 and d2, respectively. Any suitable ADC may be used to implement ADCs 202a/b For example, ADC 202a/b is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC. For purposes of explaining the various embodiments, ADCs 202a and 202b are considered to be flash ADCs.

Input power sense circuitry 202c receives the digital representations d1 and d2. In some embodiments, input power sense circuitry 202c compares the values of d1 and d2 against reference codes ref1 and ref2, respectively. In some embodiments, the same reference code is used to compare with d1 and d2 values. When current is being measured or estimated, d1 and d2 represent current. When power is being measured or estimated, d1 and d2 carry voltage and current information. The reference codes are predetermined or programmable. The reference code represents the maximum current limit of the power supply rails Vin,A and Vin,B. In some embodiments, input power sense circuitry 202c first calculates power based on values within d1 and d2. In some embodiments the same reference code is used to compare d1 and d2 values. The reference codes are predetermined or programmable. The maximum power limit of the power supply rails Vin,A and Vin,B represents the maximum power that can be drawn from power supply sources or connectors providing power supply to the power supply rails Vin,A and Vin,B. The phase assignment circuitry 202d receives the output of the comparing.

In some embodiments, phase assignment circuitry 202d determines whether the digital presentations d1 and/or d2 are above a power limit as indicated by the reference code(s). When phase assignment circuitry 202d determines that the supply rail Vin,A is not fully utilized compared to the supply rail Vin,B, then it sends a control signal to switch SW1 to couple bridge or phase f5 to supply rail Vin,A. As such, power demand from the input supply rails Vin,A and Vin,B is substantially balanced. In a similar case, when phase assignment circuitry 202d determines that the supply rail Vin,B is not fully utilized compared to the supply rail Vin,A, then it sends a control signal to switch SW1 to couple bridge or phase f5 to supply rail Vin,B. As such, power demand from input supply rails Vin,A and Vin,B is substantially balanced. This scheme of moving one or more bridge/phases from one input power supply rail to another input power supply rail results in coarse adjustment of input power load balancing.

In some embodiments, VR controller 102/202 also monitors loading conditions of SoC 103. For example, VR controller 102/202 monitors Vout to determine whether it is at its expected level (e.g., when compared with a reference voltage). To regulate Vout, VR controller 102/202 receives Vout information via communication interface 202e along with sensed power and/or current of the input supply rails, and then adjusts duty cycle of a pulse train signal that drives the high-side and/or low-side switches of each phase or bridge. SoC 103 commands a voltage for VR controller 102/202 to regulate to. In some embodiments, all input and output voltage and current measurements are performed by VR controller 102/202. By adjusting the current through the phases or bridges (e.g., by adjusting duty cycle of the pulse train signal), currents through the phases or bridges is balanced and Vout is regulated. This scheme of balancing current in each phase or bridge results in fine adjustment of input power load balancing.

In some embodiments, instead of the phase assignment circuitry 202d generating the control signal for controlling switch SW1, the control is passed to SoC 103 via communication interface 202e. SoC 103 then controls switch SW1. This implementation reduces the pin count of VR controller 102/202.

Figure 3:
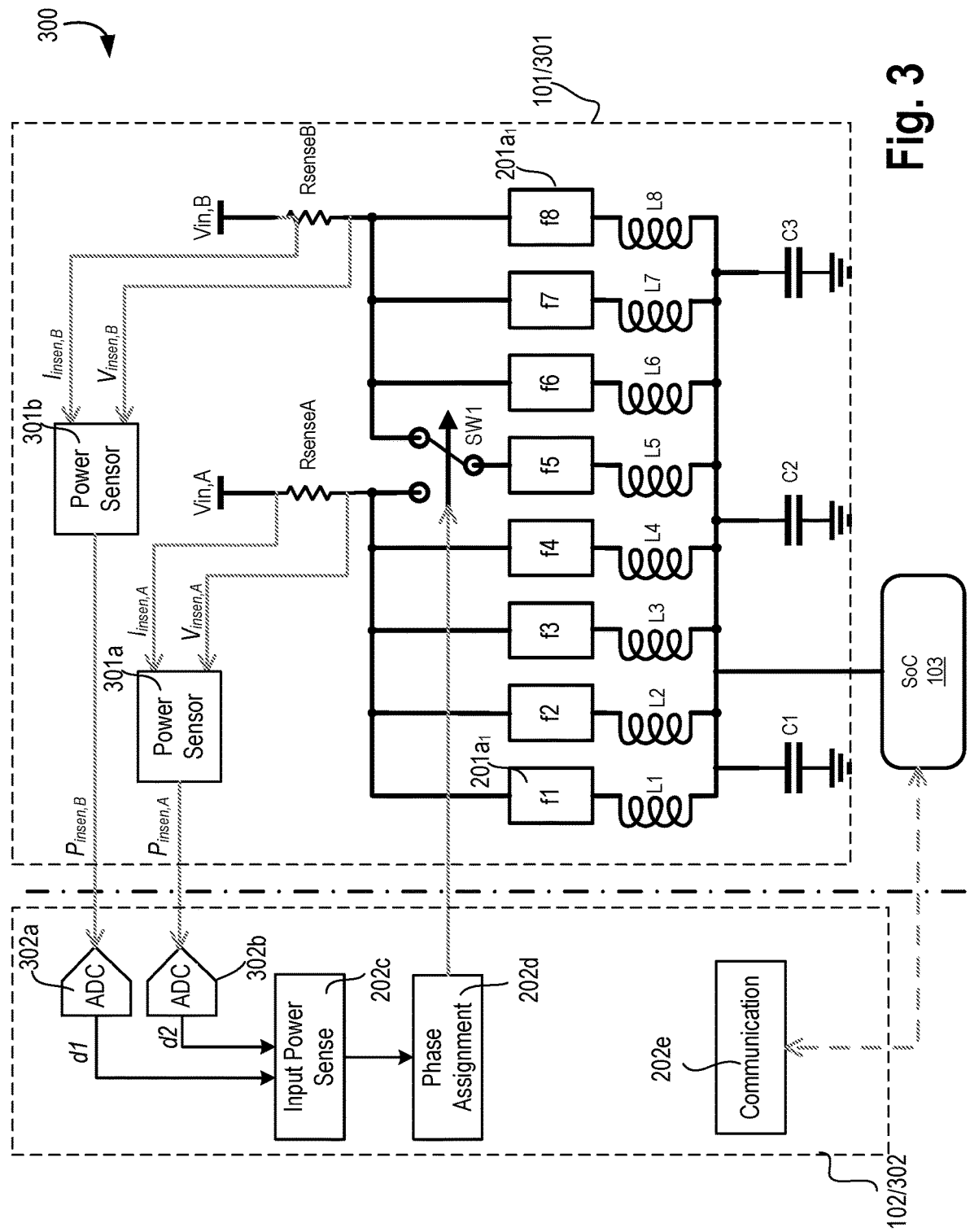
FIG. 3 illustrates an apparatus where a sensor converts voltage and/or current measurements into signal(s) representing power, and this information is used by a voltage regulator controller to send a control signal to a switch for balancing input power from multiple sources, in accordance with some embodiments.

FIG. 3 illustrates apparatus 300 where a sensor converts voltage and current measurements into signal representing power, and this information is used by a voltage regulator controller to send a control signal to a switch for balancing input power from multiple sources, in accordance with some embodiments. Apparatus 300 is similar to apparatus 200 but for the type of sense signals (Sense,A, and Sense,B) provided to VR controller 102/302. In some embodiments, a separate sensor converts the voltage and current measurements (e.g., $V_{insen,A}$, $V_{insen,B}$, and $I_{insen,B}$) into a signal representing power (e.g., $P_{insen,A}$ and $P_{insen,B}$). In some embodiments, VR bridge circuitry 101/301 measures or estimates power through the power supply rails Vin,A and Vin,B. In this case, for each power supply rail, a corresponding power sensor is coupled. For example, Power Sensor 301a couples to sense resistor RsenseA of power supply rail Vin,A, and Power Sensor 301b couples to sense resistor RsenseB of power supply rail Vin,B. Output of Power Sensor 301a is $P_{insen,A}$ while output of Power Sensor 301b is $P_{insen,B}$.

This scheme saves pins for VR controller 102/302 compared to VR controller 202. This scheme also simplifies the design of ADCs. For example, ADCs 302a/b are simpler in design than ADCs 202a/b in that each ADC 302a/b receives a single analog input signal $P_{insen,A}$ or $P_{insen,B}$ and converts that to a corresponding digital representation. If a power sensor is used, a single data conversion takes place, in accordance with some embodiments. Otherwise, VR controller 102/302 measures voltage and current, converts both quantities, and then multiplies them to get power. Similarly, if current is used to make decisions then a single data conversion takes place, in accordance with some embodiments. The operation of controlling switch SW1 for coarse adjustment and controlling current through the phases for fine adjustment is same as that explained with reference to FIG. 2.

In some embodiments, instead of the phase assignment circuitry 202d generating the control signal for controlling switch SW1, the control is passed to SoC 103 via communication interface 202e. SoC 103 then controls switch SW1. This implementation further reduces the pin count of VR controller 102/202.

Figure 4:
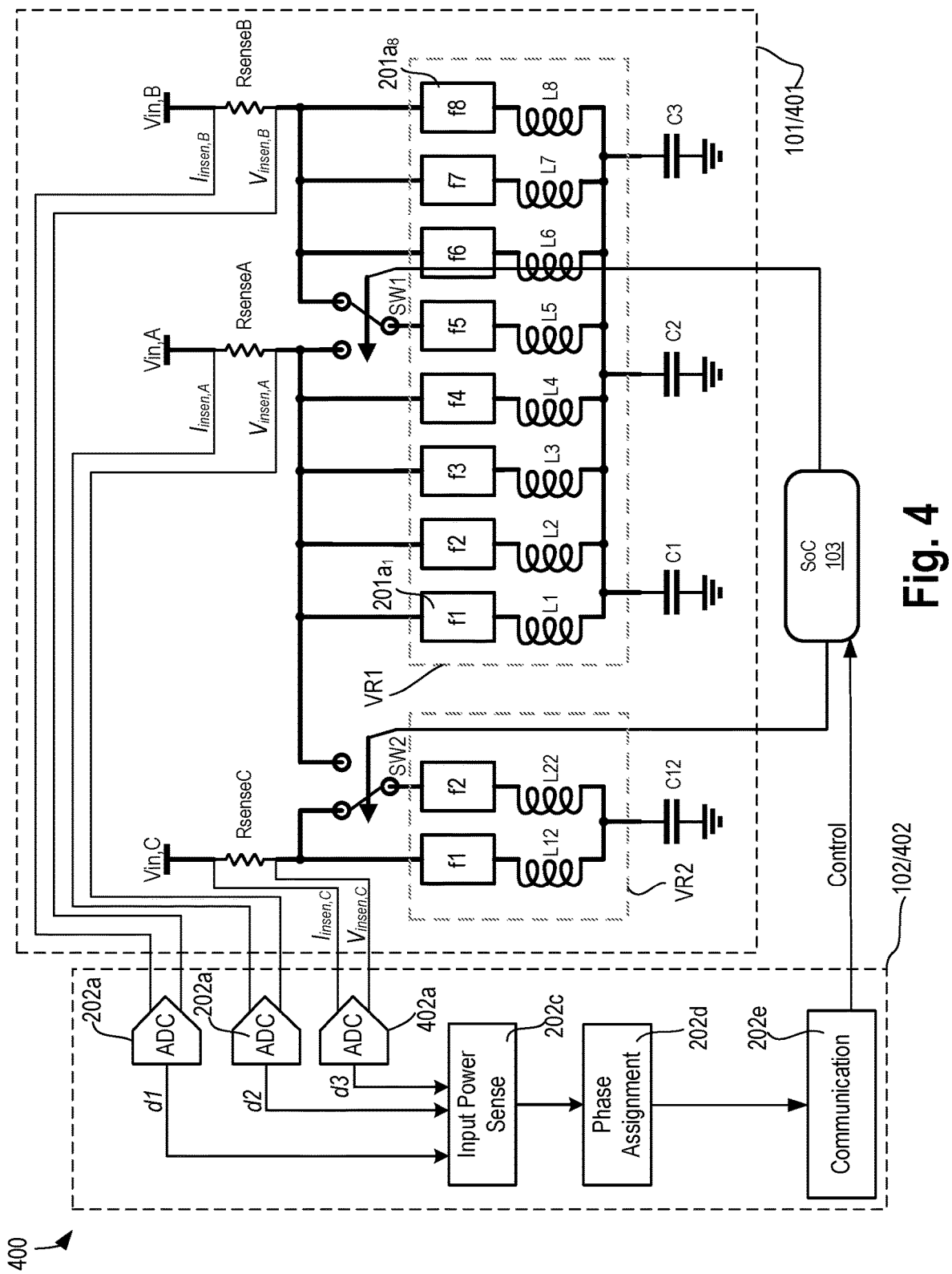
FIG. 4 illustrates an apparatus where the voltage regulator controller communicates power level to a processor, which in turn decides the control of the switch for balancing input power from multiple sources, in accordance with some embodiments.

FIG. 4 illustrates apparatus 400 where the voltage regulator controller communicates power level to a processor, which in turn decides the control of the switch for balancing input power from multiple sources, in accordance with some embodiments. Compared to FIG. 2, here an additional VR driver VR2, switch SW2, and power supply rail Vin,C is shown for VR bridge 101/401. VR Driver VR2 has two bridges f1 and f2, which couple to two corresponding inductors L12 and L22, which in turn are coupled to capacitor C12. In some embodiments, SW2 couples bridge/phase f2 of VR2 to first supply rail Vin,A. In some embodiments, SW2 couples bridge/phase f2 of VR2 to third supply rail Vin,C. Here, two bridges f1 and f2 are shown for VR driver VR2. However, VR driver VR2 can have any number of bridges of phases where at least one phase or bridge is switchable between first supply rail Vin,A and third supply rail Vin,C. While switch SW2 is shown to couple phase or bridge f2 of VR2, it can also be used to couple bridge or phase f1 of VR1 to third power supply rail Vin,C.

To sense, estimate, and/or measure electrical characteristics of the power supply rails (e.g., $V_{insen,C}$ and $I_{insen,C}$), a sense resistor RsenseC is coupled between VR2 and third supply rail Vin,C. VR controller 102/402 receives the sense information from the third input power supply rail Vin,C (e.g., $V_{insen,C}$ and $I_{insen,C}$) along with sense information from the first input power supply rail Vin,A (e.g., $V_{insen,A}$ and $I_{insen,A}$), and the sense information from the second input power supply rail Vin,B (e.g., $V_{insen,B}$ and $I_{insen,B}$). VR controller 102/402 includes an additional ADC 402b to convert the sense information from the third input power supply rail Vin,C (e.g., $V_{insen,C}$ and $I_{insen,C}$) into its digital representation d3.

In some embodiments, input power sense circuitry 202c compares the values of d1, d2, and d3 against reference codes ref1, ref2, and ref3, respectively. In some embodiments, the same reference code is compared with d1, d2, and d3 values. The reference codes are predetermined or programmable. The reference codes represent the maximum power limit of the power supply rails Vin,A, Vin,B, and Vin,C. For example, ref1 represents the power limit of Vin,A, ref2 represents the power limit of Vin,B, and ref3 represents the power limit of Vin,C. The maximum power limit of the power supply rails Vin,A, Vin,B, and Vin,C represent the maximum power that can be drawn from power supply sources or connectors providing power supply to power supply rails Vin,A, Vin,B, and Vin,C, respectively. In some embodiments, phase assignment circuitry 202d receives the output of the comparing.

In some embodiments, phase assignment circuitry 202d determines whether the digital presentations d1, d2, and/or d3 are above the power limits as indicated by the reference code(s). When phase assignment circuitry 202d determines that supply rail Vin,A is not fully utilized compared to supply rail Vin,B, then it sends a control signal to switch SW1 to couple bridge or phase f5 to supply rail Vin,A. As such, power demand from input supply rails Vin,A and Vin,B is substantially balanced. In a similar case, when phase assignment circuitry 202d determines that supply rail Vin.B is not fully utilized compared to supply rail Vin,A, then it sends a control signal to switch SW1 to couple bridge or phase f5 to supply rail Vin,B.

In some embodiments, when phase assignment circuitry 202d determines that supply rail Vin.A is not fully utilized compared to supply rail Vin,C, then it sends a control signal to switch SW2 to couple bridge or phase f2 to supply rail Vin,A. As such, power demand from input supply rails Vin,C and Vin,A is substantially balanced. In a similar case, when phase assignment circuitry 202d determines that supply rail Vin.C is not fully utilized compared to supply rail Vin,A, then it sends a control signal to switch SW2 to couple bridge or phase f2 to supply rail Vin,C. As such, power demand from input supply rails Vin,A Vin,B, and Vin,C is substantially balanced. This scheme of moving one or more bridge/ phases from one input power supply rail to another input power supply rail results in coarse adjustment of input power load balancing.

In some embodiments, instead of the phase assignment circuitry 202d generating the control signals for controlling switches SW1 and SW2, the controls are passed to SoC 103 via communication interface 202e. SoC 103 then controls switches SW1 and SW2. This implementation further reduces the pin count of VR controller 102/402.

Figure 5:
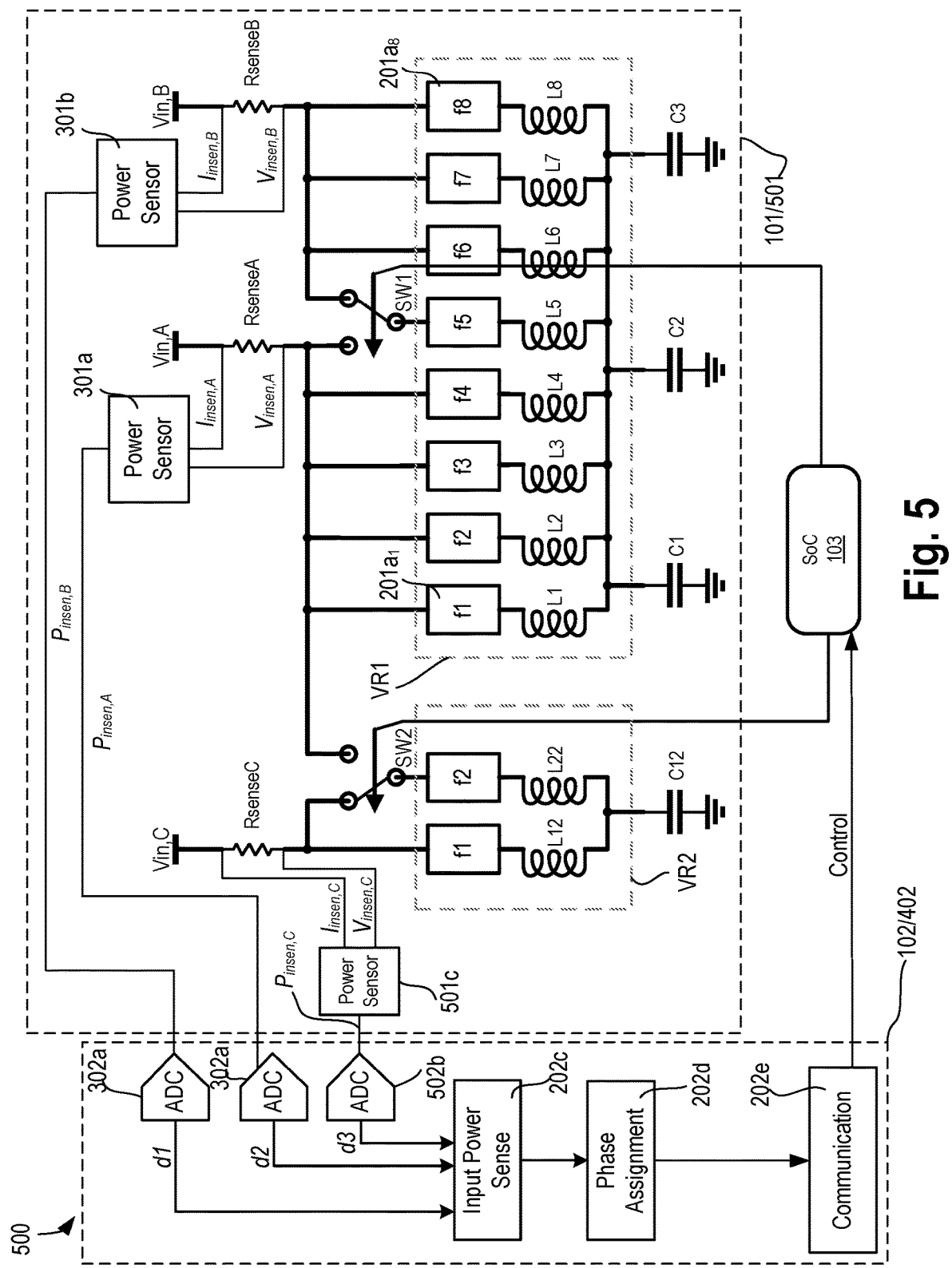
FIG. 5 illustrates an apparatus with more than two input power supply rails, wherein one or more switches are controlled for balancing input power from multiple sources, in accordance with some embodiments.

FIG. 5 illustrates apparatus 500 with more than two input power supply rails, wherein one or more switches are controlled for balancing input power from multiple sources, in accordance with some embodiments. Apparatus 500 is similar to apparatus 400 but for the type of sense signals provided to VR controller 102/402. In some embodiments, separate sensors converts the voltage and current measurements into signals representing power. In some embodiments, VR bridge circuitry 101/501 measures or estimates power through the power supply rails Vin,A Vin,B. and Vin,C In this case, for each power supply rail, a corresponding power sensor is coupled. For example, Power Sensor 301a couples to sense resistor RsenseA of power supply rail Vin,A, Power Sensor 301b couples to sense resistor RsenseB of power supply rail Vin,B, and Power Sensor 501c couples to sense resistor RsenseC of power supply rail Vin,C. The output of power sensor 301a is $P_{insen,A}$ the output of Power Sensor 301b is $P_{insen,B}$, and the output of power sensor 501c is $P_{insen,C}$.

This scheme saves pins for VR controller 102/502 compared to VR controller 102/402. This scheme also simplifies the design of ADCs. For example, ADCs 302a/b and 502b are simpler in design than ADCs 202a/b and 402a in that each ADC 302a/b and 501c receives a single analog input signal $P_{insen,A}$, $P_{insen,B}$, or $P_{insen,C}$ and converts that to corresponding digital representations d1, d2, or d3, respectively. The operation of controlling switches SW1 and SW2 for coarse adjustment and controlling current through the phases for fine adjustment is same as that explained with reference to FIG. 4.

In some embodiments, instead of the phase assignment circuitry 202d generating the control signals for controlling switches SW1 and SW2, the controls are passed to SoC 103 via communication interface 202e. SoC 103 then controls switches SW1 and SW2. This implementation further reduces the pin count of VR controller 102/402.

Figure 6:
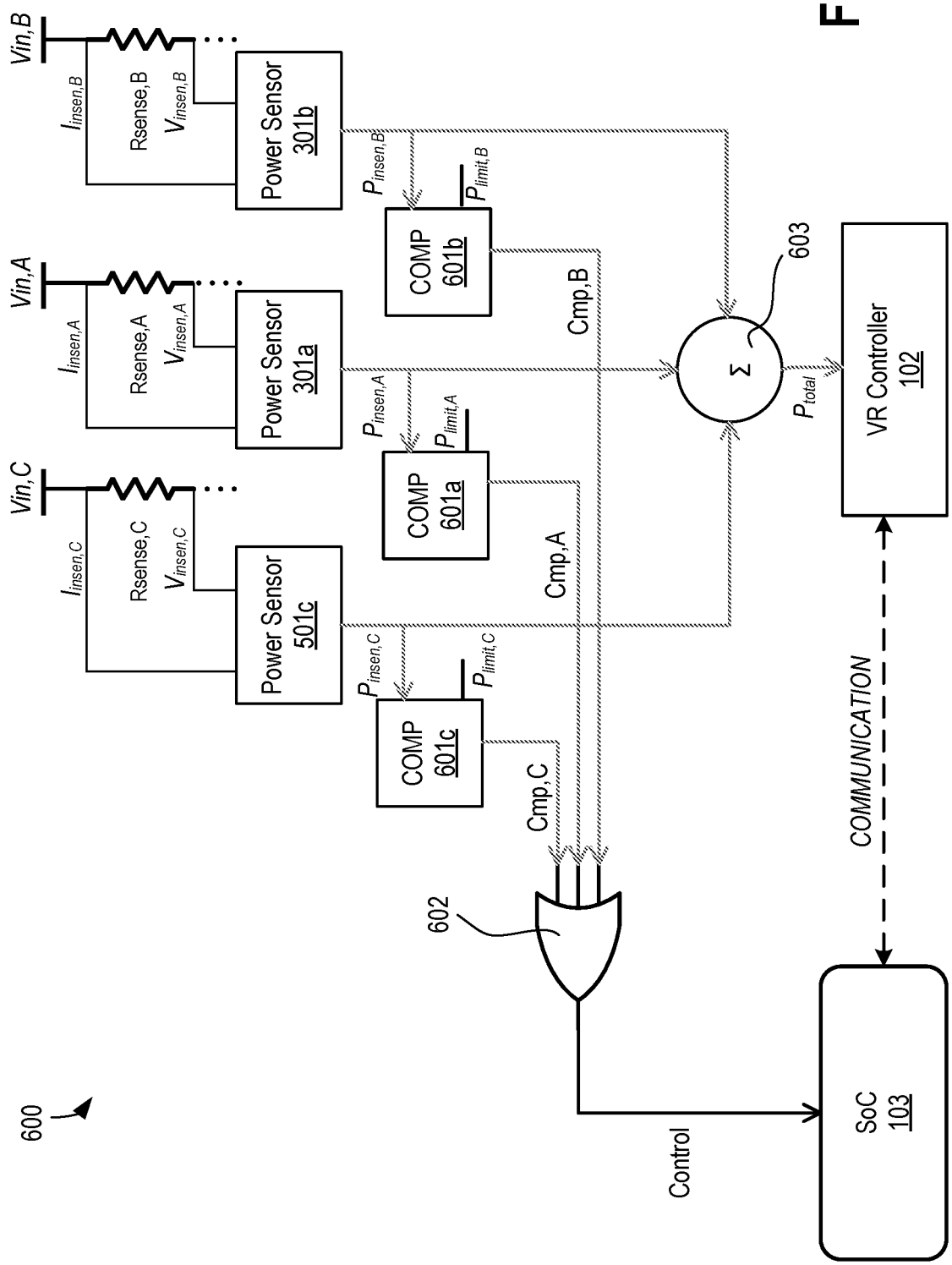
FIG. 6 illustrates an apparatus showing details of the apparatus of FIG. 5, where input power of each input sources is sensed, summed, and fed to the VR controller for balancing input power from multiple sources, in accordance with some embodiments.

FIG. 6 illustrates apparatus 600 showing details of the apparatus of FIG. 5, where input power of each input sources is sensed, summed, and fed to the VR controller for balancing input power from multiple sources, in accordance with some embodiments. Apparatus 600 comprises comparators 601a, 601b, and 601c for each power sensor 301a, 301b, and 501c, respectively. Apparatus 600 also includes an OR logic gate 602 that generates the control for SoC 103. In some embodiments, SoC 103 also receives the sum $P_{total}$ of P all sensed powers (e.g., $P_{insen,A}$, $P_{insen,B}$, $P_{insen,C}$). Node 603 generates the sum $P_{total}$ of all sensed powers (e.g., $P_{insen,A}$, $P_{insen,B}$, $P_{insen,C}$). VR Controller 102 receives $P_{total}$. Comparator 601a compares $P_{insen,A}$ with reference $P_{limit,A}$. The output of comparator 601a is Cmp,A. Comparator 601b compares $P_{insen,B}$ with reference $P_{limit,B}$. The output of comparator 601b is Cmp,B. Comparator 601c compares $P_{insen,C}$ with reference $P_{limit,C}$. The output of comparator 601c is Cmp,C. OR gate 602 performs an OR logic function on Cmp,A, CmpB, and Cmp,C, and generates a control signal for SoC 103. The control signal indicates over-power on one or more power sources. SoC 103 then generates the appropriate control signals for the switches SW1 and/or SW2 to move the phases or bridges from one power supply rail to another power supply rail to balance the power drawn from the input power supply rails.

Figure 7:
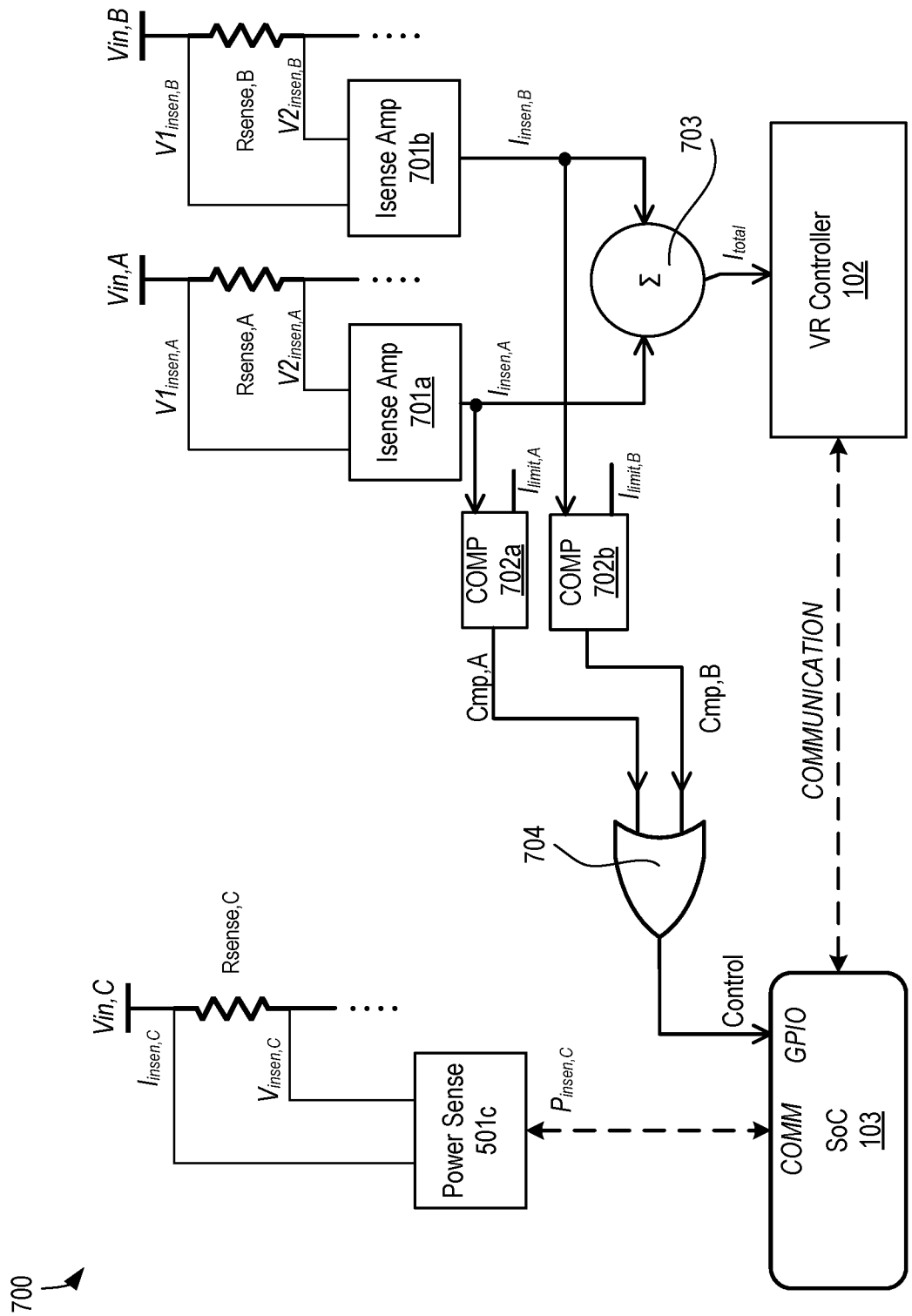
FIG. 7 illustrates an apparatus showing details of the apparatus of FIG. 5, where input current of some but not all input sources is sensed, summed, and fed to the VR controller for balancing input power from multiple sources, in accordance with some embodiments.

FIG. 7 illustrates apparatus 700 showing details of the apparatus of FIG. 5, where input current of some but not all input sources is sensed, summed, and fed to the VR controller for balancing input power from multiple sources, in accordance with some embodiments. Sometimes it may not be desirable to feed all input current sensor signals to VR controller 102. For example, the printed circuit board (PCB) layout, stack-up of layers in the PCB, and signal integrity constraints may not allow $I_{insen,A}$, $I_{insen,B}$, or $I_{insen,C}$ to be summed up at node 703 for VR controller 102. Physically distant power supply sources can have their own current sensors which communicates with SoC 103 independently. SoC 103 then generates the control signals for switches SW1 and SW2.

Apparatus 700 comprises comparators 702a and 702b for a subset of current sensors (or amplifiers) 701a and 701b, respectively. Current sensor 701a senses the current through resistor Rsense,A on the first power supply rail Vin,A. The current $I_{insen,A}$ is measured by measuring voltage $V1_{insen,A}$ and $V2_{insen,A}$ across resistor RsenseA. Current sensor 701b senses the current through resistor Rsense,B on the first power supply rail Vin,B. The current $I_{insen,B}$ is measured by measuring voltage $V1_{insen,B}$ and $V2_{insen,B}$ across resistor RsenseB.

Apparatus 700 also includes an OR logic gate 704 that generates the control for SoC 103. In some embodiments, SoC 103 also receives the sum current $I_{total}$ of a subset of sensed or measured currents (e.g., $I_{insen,A}$ and $I_{insen,B}$). Node 703 generates the sum $I_{total}$ of all sensed currents (e.g., $I_{insen,A}$ and $I_{insen,B}$). VR Controller 102 receives $I_{total}$. Comparator 702a compares $I_{insen,A}$ with reference current limit $I_{insen,A}$. The output of comparator 702a is Cmp,A. Comparator 702b compares $I_{insen,B}$ with reference current limit $P_{limit,B}$. The output of comparator 702b is Cmp,B. OR gate 602 performs an OR logic function on Cmp,A and CmpB, and generates a control signal for SoC 103. The control current information signal indicates over-power condition on one or more power sources. SoC also directly receives power sensed through the third power supply rail Vin,C via Power Sensor 501c. SoC 103 then generates the appropriate control signals for the switches SW1 and/or SW2 to move the phases or bridges from one power supply rail to another power supply rail to balance the power drawn from the input power supply rails.

Figure 8:
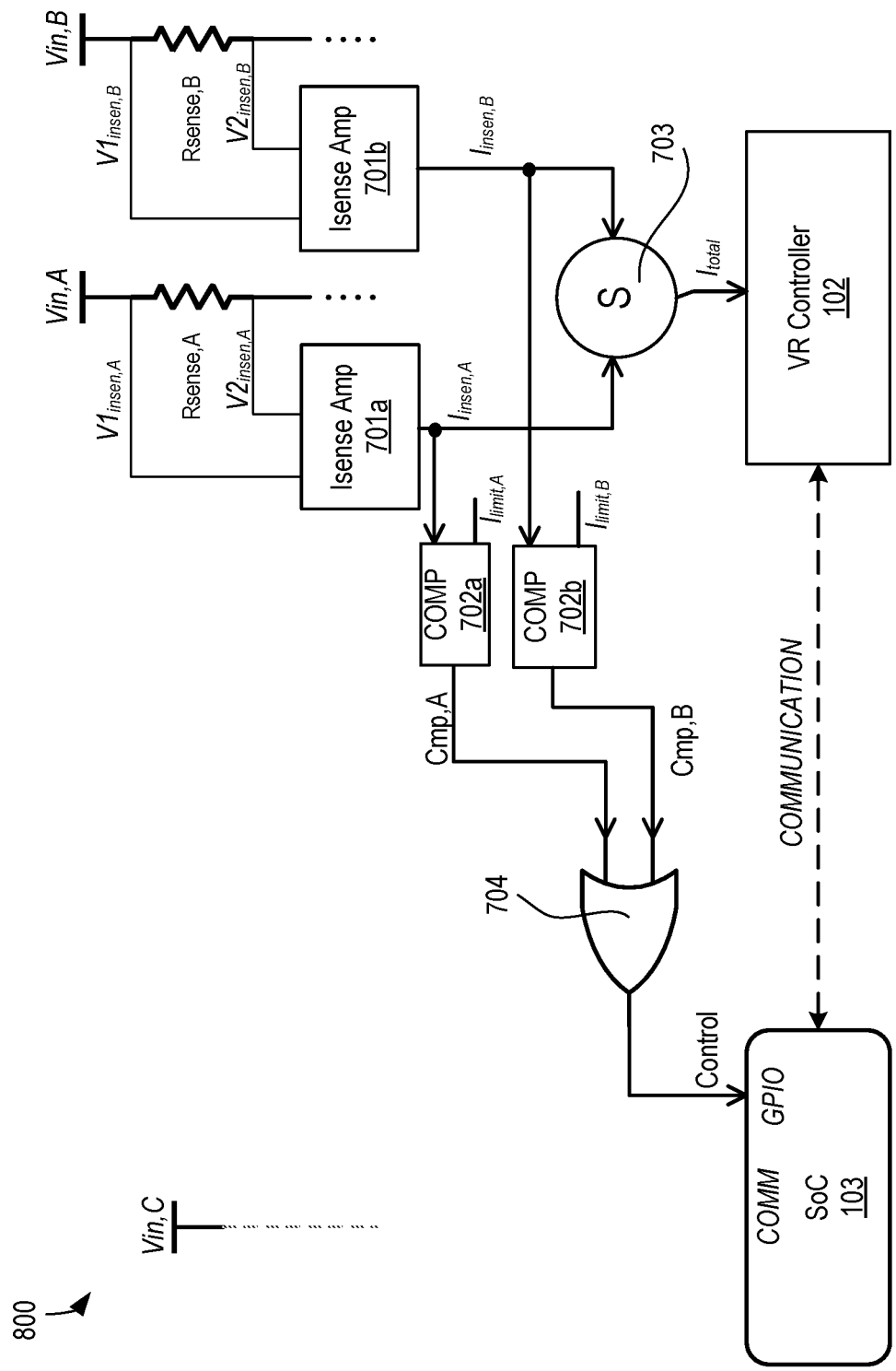
FIG. 8 illustrates an apparatus showing details of a modified apparatus of FIG. 5, where current measurement and inference of power draw is used for balancing input power from multiple sources, in accordance with some embodiments.

FIG. 8 illustrates apparatus 800 showing details of a modified apparatus of FIG. 5, where current measurement and inference of power draw is used for balancing input power from multiple sources, in accordance with some embodiments. Apparatus 800 is similar to apparatus 700 but for inferring power draw from the third power supply rail Vin,C. For example, SoC 103 knows the current it is consuming and from that information SoC 103 knows power drawn from third power supply rail Vin,C in view of the total current $I_{total}$. $I_{total}$ is the sum of currents $I_{insen,A}$ and $I_{insen,B}$.

In some embodiments, total input power is modeled by measuring two of the three sources as:

$$P_{in,measured} = P_{in,A} + P_{in,B}$$

$$P_{in,total} = P_{in,measured} + P_{in,C:model}$$

A linear extrapolation can be programmed after system validation to model the power used by source Vin,C as:

$$P_{in,total} = P_{in,measured} + K_{pwr} P_{in,measured} + P_{in,C:Static}$$

$$P_{in,total} = (1 + K_{pwr}) P_{in,measured} + P_{in,C:static}$$

Where $K_{pwr}$ is linear gain, and $P_{in,C:Static}$ is an offset power that exists when 0 Watt is measured.

SoC 103 then generates the appropriate control signals for the switches SW1 and/or SW2 to move the phases or bridges from one power supply rail to another power supply rail to balance the power drawn from the input power supply rails.

Figure 9:
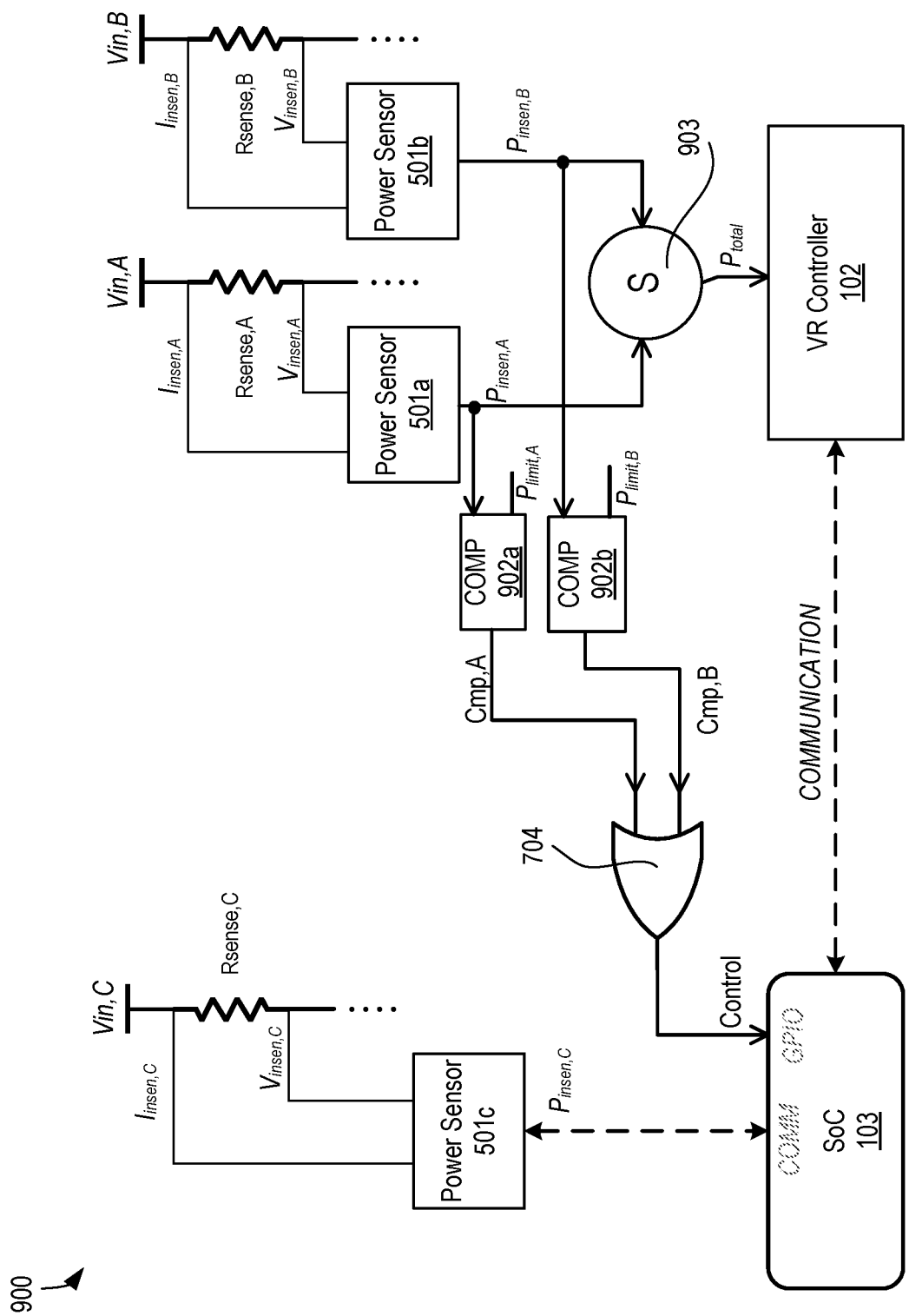
FIG. 9 illustrates apparatus showing details of the apparatus of FIG. 5, where input power of some but not all input sources is sensed, summed, and fed to the VR controller for balancing input power from multiple sources, in accordance with some embodiments.

FIG. 9 illustrates apparatus 900 showing details of the apparatus of FIG. 5, where input power of some but not all input sources is sensed, summed, and fed to the VR controller for balancing input power from multiple sources, in accordance with some embodiments. Sometimes it may not be desirable to feed all input power sensor signals to VR controller 102. For example, the PCB layout, stack-up of layers in the PCB, and signal integrity constraints may not allow power measurements $P_{insen,A}$, $P_{insen,B}$, or $P_{insen,C}$ to be summed up at node 903 for VR controller 102. Physically distant power supply sources can have their own power sensors which communicates with SoC 103 independently. SoC 103 then generates the control signals for switches SW1 and SW2. In this example, Power Sensor 501c generates its own power measurements and sends it directly to SoC 103.

Apparatus 900 comprises comparators 902a and 902b for a subset of power sensors 501a and 501b, respectively. Power Sensor 501a senses the current through resistor Rsense,A on the first power supply rail Vin,A. Apparatus 900 also includes an OR logic gate 704 that generates the control for SoC 103. In some embodiments, SoC 103 also receives the sum power $P_{total}$ of a subset of sensed or measured power (e.g., $P_{insen,A}$ and $P_{insen,B}$). Node 903 generates the sum $P_{total}$ of all sensed powers (e.g., $P_{insen,A}$ and $P_{insenB}$). VR Controller 102 receives $P_{total}$. Comparator 902a compares $P_{insen,A}$ with reference power limit $P_{limit,A}$. The output of comparator 902a is Cmp,A. Comparator 902b compares $P_{insen,B}$ with reference power limit $P_{limit,B}$. The output of comparator 902b is Cmp,B. OR gate 704 performs an OR logic function on Cmp,A and CmpB, and generates a control signal for SoC 103. SoC 103 then generates the appropriate control signals for the switches SW1 and/or SW2 in view of the total power, control signal, and power measurement from Power Sensor 501c to move the phases or bridges from one power supply rail to another power supply rail to balance the power drawn from the input power supply rails.

In various embodiments, the comparators, summation node, and OR gate are positioned in the VR bridge 101 or VR controller 102.

Figure 10:
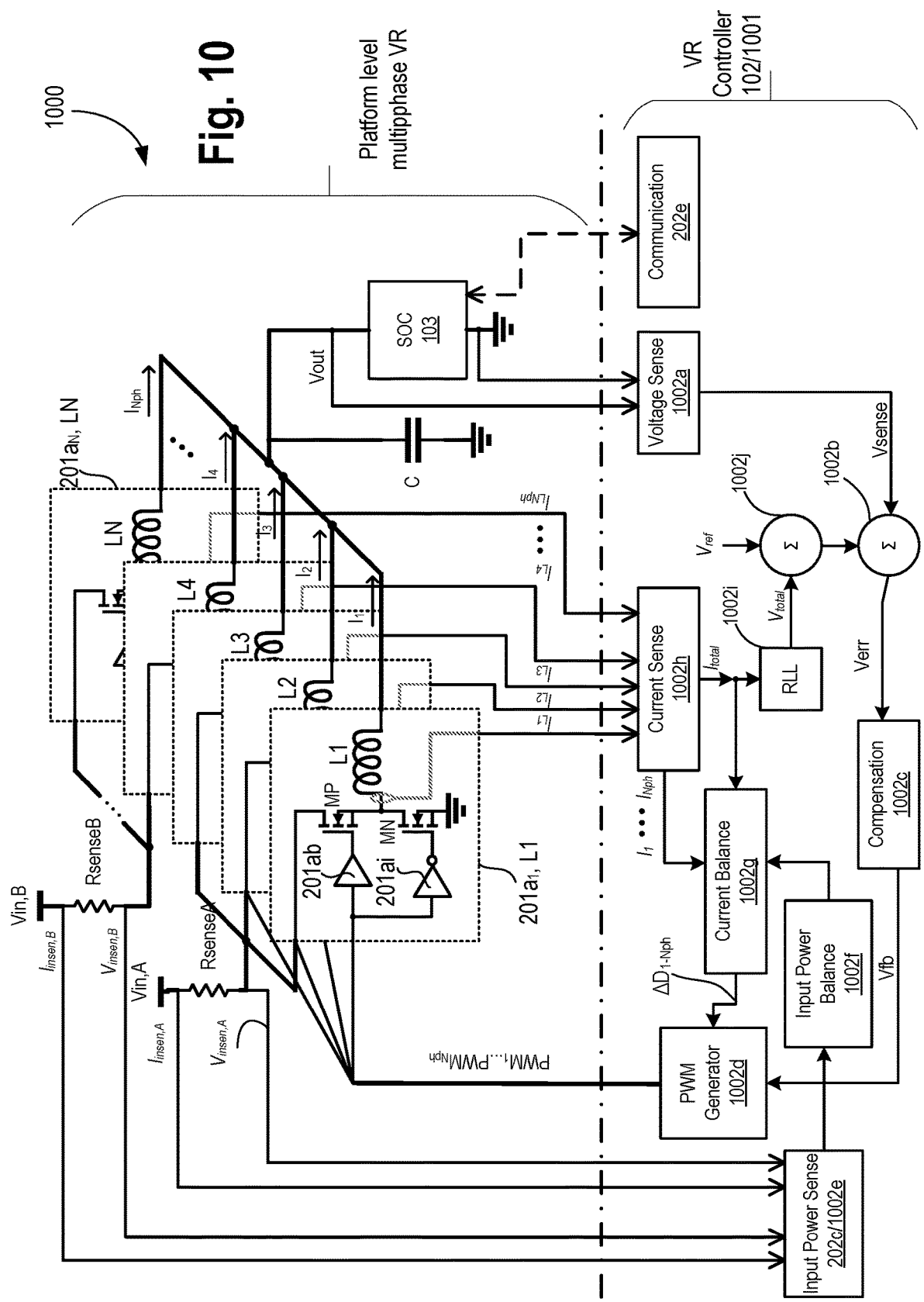
FIG. 10 illustrates an apparatus showing details of a modified apparatus of FIG. 2, in accordance with some embodiments.

FIG. 10 illustrates apparatus 1000 with details of a modified apparatus of FIG. 2, in accordance with some embodiments. In this example, phases 1-3 (e.g., $201a_{1-3}$) are connected to the first power supply rail Vin,A, while phases 4 through Nph (e.g., $201a_{4-Nph}$) are connected to second power rail Vin,B. Each bridge or phase (e.g., $201a_{1-N}$) is shown with a high-side switch MP and a low-side switch MN coupled in series. The high-side switch MP is controllable by buffer or driver 201ab while the low side switch MN is controllable by inverter 201ai. Both the buffer 201ab and inverter 201ai are driven by a corresponding pulse width modulated (PWM) signal. For example, bridge or phase $201a_1$ is driven by $PWM_1$, bridge or phase $201a_2$ is driven by PWM2, and bridge $201a_{Ni}$ is driven by $PWM_{Nph}$.

VR controller 102/1001 comprises voltage sense circuitry 1002a, summation node 1002b, compensation circuitry 1002c, PWM generator 1002d, input power sense circuitry 1002e/202c, input power balance circuitry 1002f, current balance circuitry 1002g, current sense circuitry 1002h, resistor ladder 1002i, and summing node 1002j.

In some embodiments, voltage sense 1002a comprises a voltage divider that divides down Vout to a lower representative voltage Vsense. Circuitry 1002b provides Verr', which is the difference between a modified value of Vref and the sensed voltage. For example, a voltage VLL is subtracted from Vref to generate a modified Vref. The voltage VLL is the product of measured current $I_{total}$ and load-line resistance 1002i. Compensator 1002c receives Verr. Compensator 1002c generates a modified reference voltage Vfb (feedback voltage) for PWM generator 1002d.

PWM generator 1002d comprises a waveform synthesizer and N comparators or amplifiers. The N comparators or amplifiers receive Vfb from compensation circuitry 1002c and the output of waveform synthesizer, and generates outputs which are the $PWM_{1-Nph}$ signals for timing control and for bridge drivers 201ab and 201ai of bridges $201a_{1-N}$. The output of waveform synthesizer are N number of triangular waves. In some embodiments, the triangular waves are periodic and have a voltage swing between Vh (high voltage threshold) and V1 (low voltage reference). In some embodiments the waveform synthesizer produces N number of sawtooth waves.

In some embodiments, current balance circuitry 1002g comprises N current mixers. In some embodiments, current mixers receive sensed phase currents ($i_{(1-Nph)}$) of each bridge from among bridges $201a_{1-N}$ and subtract average current from all bridges $201a_{1-N}$ to generate error currents which are used to generate corresponding voltage for inputs of corresponding comparators of PWM generator 1002d. The feedback voltage (i.e., output of compensation 1002c) of each phase (or bridge) is shifted up or down. In some embodiments, shifting the feedback voltage up increases the PWM duty cycle which increases phase current, and shifting the feedback voltage down decreases the PWM duty cycle which decreases phase current (i.e., from output of bridge from among bridge $201a_{1-N}$). In standard controllers, current balance circuitry 1002g has a compensation network for individual phase currents to introduce delta duty cycles for each phase in an attempt to balance the current. So each phase duty cycle is the sum of the common duty cycle and current balance duty cycle.

The VR controller 102 has two loops—main voltage loop and current loop. For the voltage loop, $RLL = R_{load-line}$; $Vtarget = V_{ref} - VLL = V_{ref} - (I_{total} * RLL)$, then Verr=Vtarget−Vsense; which is compensated to produce a common duty cycle for all phases. The main VR loop (including PWM 1002d→bridge drivers $201a_{1-N}$→Voltage sense 1002a→compensator 1002c) regulates the output voltage Vout while the current sensing loop (including current mixers→comparators→bridge drivers 201a$_{1-N}$→current sensors 1002h→current balance 1002g) checks and maintains that all phases (i.e., bridges 201a$_{1-N}$) generate the same amount of current.

Figures 15A, 15B:
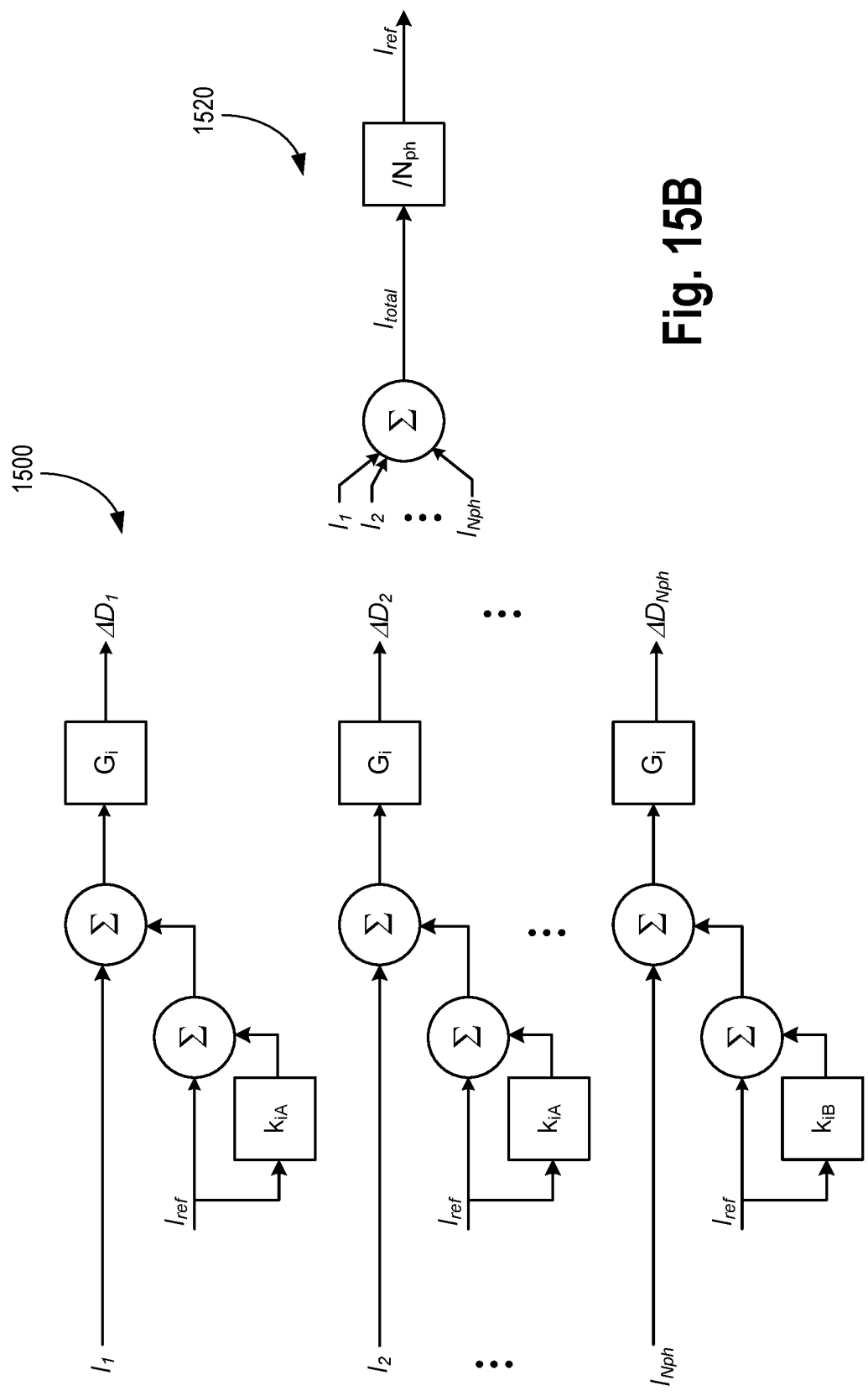

In some embodiments, current sensor 1002h is in VR controller 102. In some embodiments, current sensor 1002h are within the power stages and the sensed current is received by VR controller 102. Current sense block 1002h receives current information from all phases and passes individual phase currents and their sum I$_{total}$ to Current Balance 1002g. I$_{total}$ is also used in the voltage loop for load line (LL). The total current through all phases or bridges 201a$_{1-N}$ is I$_{total}$ (e.g., I$_{total}$ is the sum of currents I$_{L1}$ through I$_{LNph}$) I$_{total}$ is converted to a corresponding voltage V$_{total}$ via load-line resistance 1002i. By adjusting V$_{ref}$, duty cycle of PWM signals is modified, which in turn changes the current flow through bridges 201a$_{1-N}$. The output of current balance circuitry 1002g is ΔD$_{1-Nph}$. FIG. 15A illustrates the generation of ΔD$_{1-Nph}$.

Input power sense 202c/1002e senses input signals of the input power supplied by power supply rails Vin,A and Vin,B. In general, Input Power Sense 202c/1002e calculates the measured input power using measured voltage and current, measured power (from an external power sensor), or measured current and programmed voltage (e.g., assume 12V, measure current). SOC 103 receives information sensed by Input Power Sense 202c/1002e through communication 202e. Power supplied by sources Vin,A and Vin,B are communicated to Input Power Balance 1002f. Input Power Balance 1002f generates scaling factors k$_{iA}$ and k$_{iB}$ used in Current Balance 1002g. In some embodiments, scaling factors k$_{iA}$ and k$_{iB}$ are generated to balance sources VinA, VinB proportional to their limits (See, e.g., FIG. 13). In some embodiments, scaling factors k$_{iA}$ and k$_{iB}$ are generated to balance the available (or unused) power of sources VinA, VinB (See, e.g., FIG. 14). In some embodiments, scaling factors k$_{iA}$, k$_{iB}$ are used to scale the reference current Iref in Current Balance 1002g (See, e.g., FIG. 15A). In some embodiments, k$_{iA}$,k$_{iB}$ scale the measured phase current I$_1$, I$_2$, ... I$_{Nph}$ in Current Balance 1002g.

Figure 11:
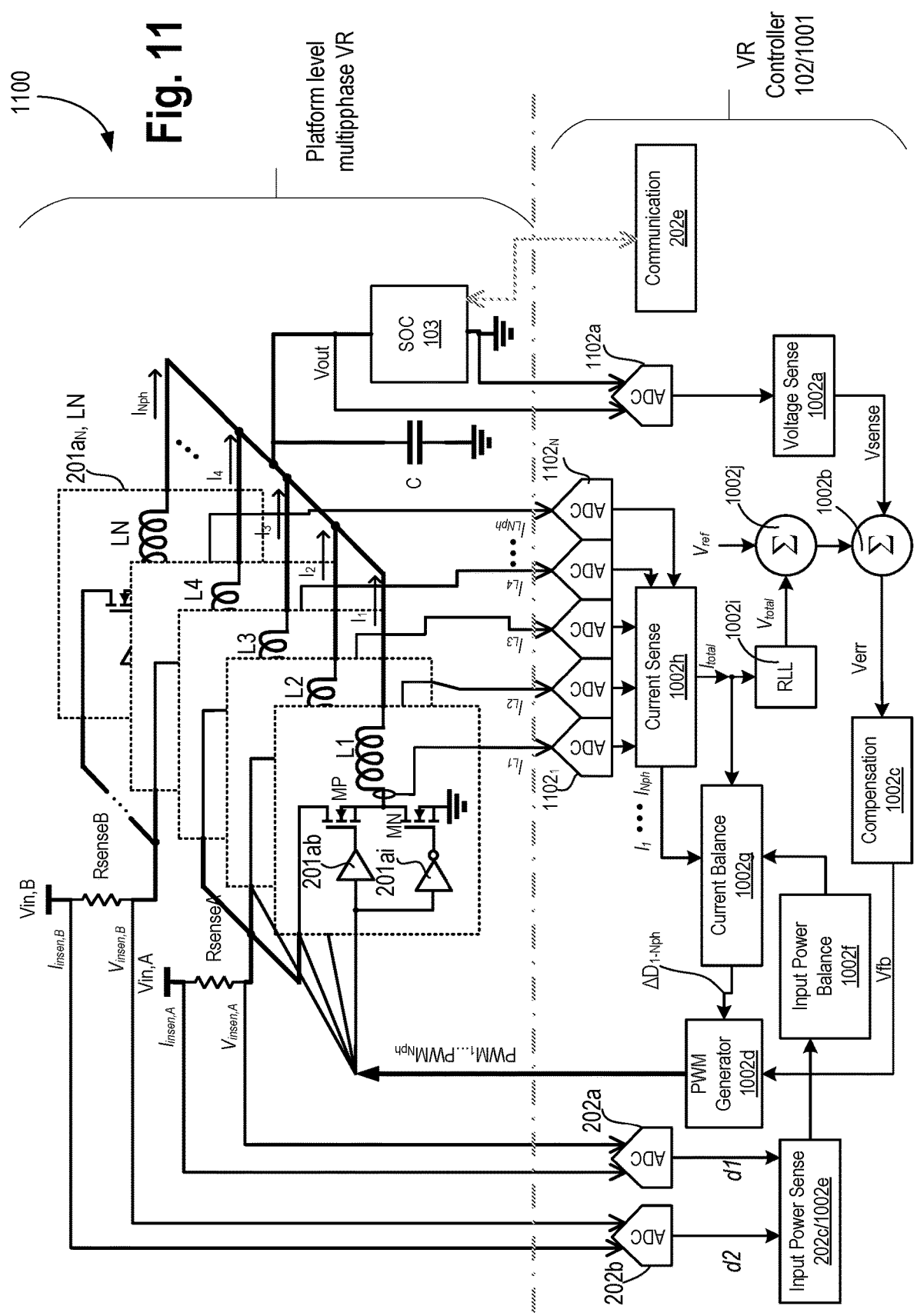
FIG. 11 illustrates an apparatus showing details of the apparatus of FIG. 2, in accordance with some embodiments.

FIG. 11 illustrates apparatus 1100 with details of the apparatus of FIG. 2, in accordance with some embodiments. Compared to FIG. 10, here ADCs 202a/b provides digital representations of the measured current (and/or voltage) or power through the first and second power supply rails, and this information is provided to power sense 1002e. In various embodiments, current sense 1002h generates digital codes representing the current through each phase. In one such embodiments, ADCs 1102$_{1-N}$ are provided to convert analog current I$_{L1}$ though I$_{LNph}$ into corresponding digital representations, and these digital representations are used by current sense 1002h to generate codes for sensed currents I$_1$ through I$_{Nph}$. Input power sense 202c/1002e receives digital representation of input signals of the input power supplied by Vin,A and Vin,B. In some embodiments, d1 and d2 contain voltage and current information of sources Vin,A and Vin,B. In some embodiments, d1 and d2 contain current information of sources Vin,A and Vin,B. Voltage information required to calculate power may be a programmable value. SOC 103 receives information contained in d1 and d2 through communication 202e.

Figure 12:
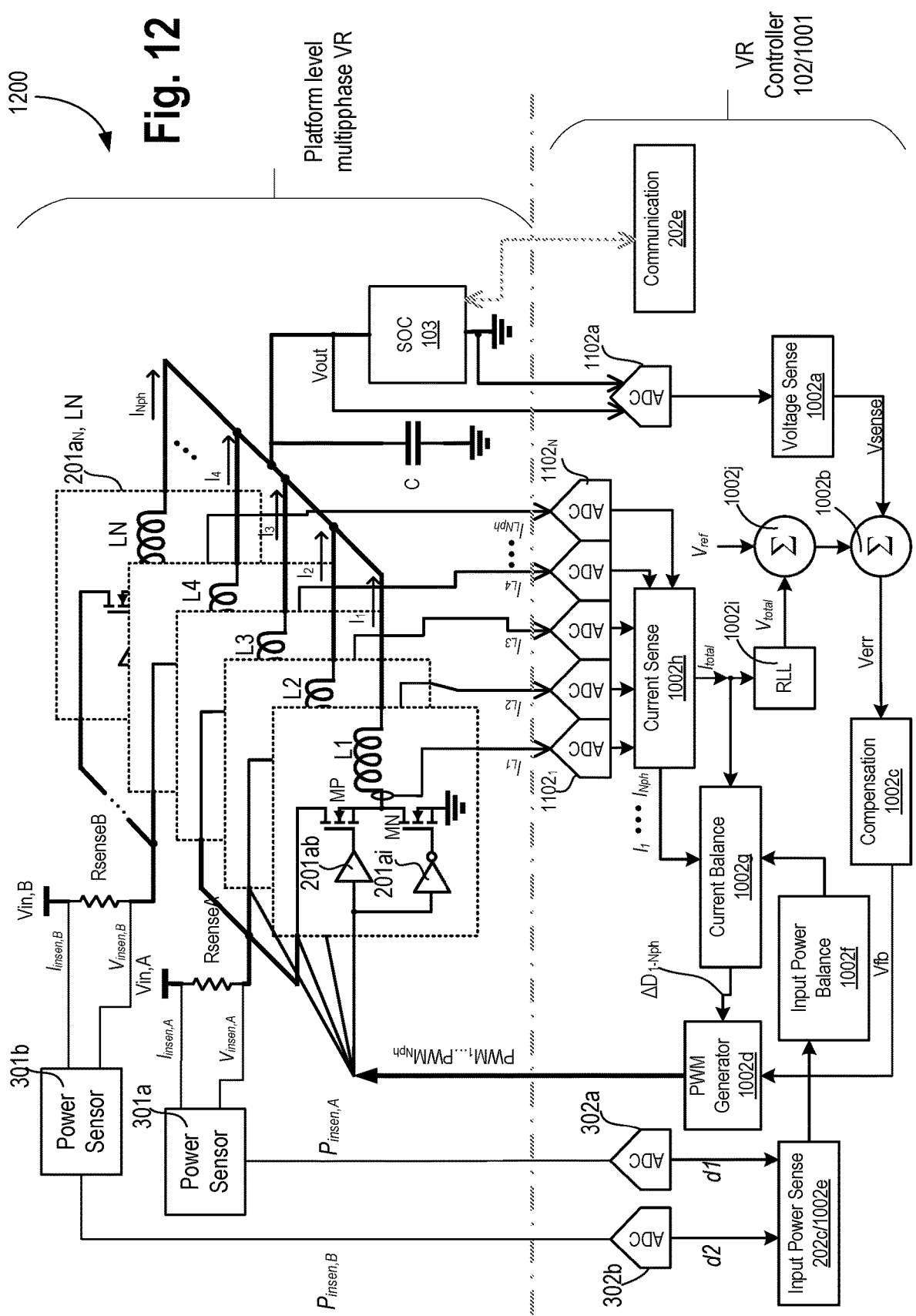
FIG. 12 illustrates an apparatus showing details of the apparatus of FIG. 3 where a separate sensor converts the voltage and current measurements into a signal representing power, in accordance with some embodiments.

FIG. 12 illustrates apparatus 1200 details of the apparatus of FIG. 3 where a separate sensor converts the voltage and current measurements into a signal representing power, in accordance with some embodiments. Compared to FIG. 11, here separate sensors 301a/b convert the voltage and current measurements into a signal representing power. This saves pins on the VR controller 102/1001.

Figure 13:
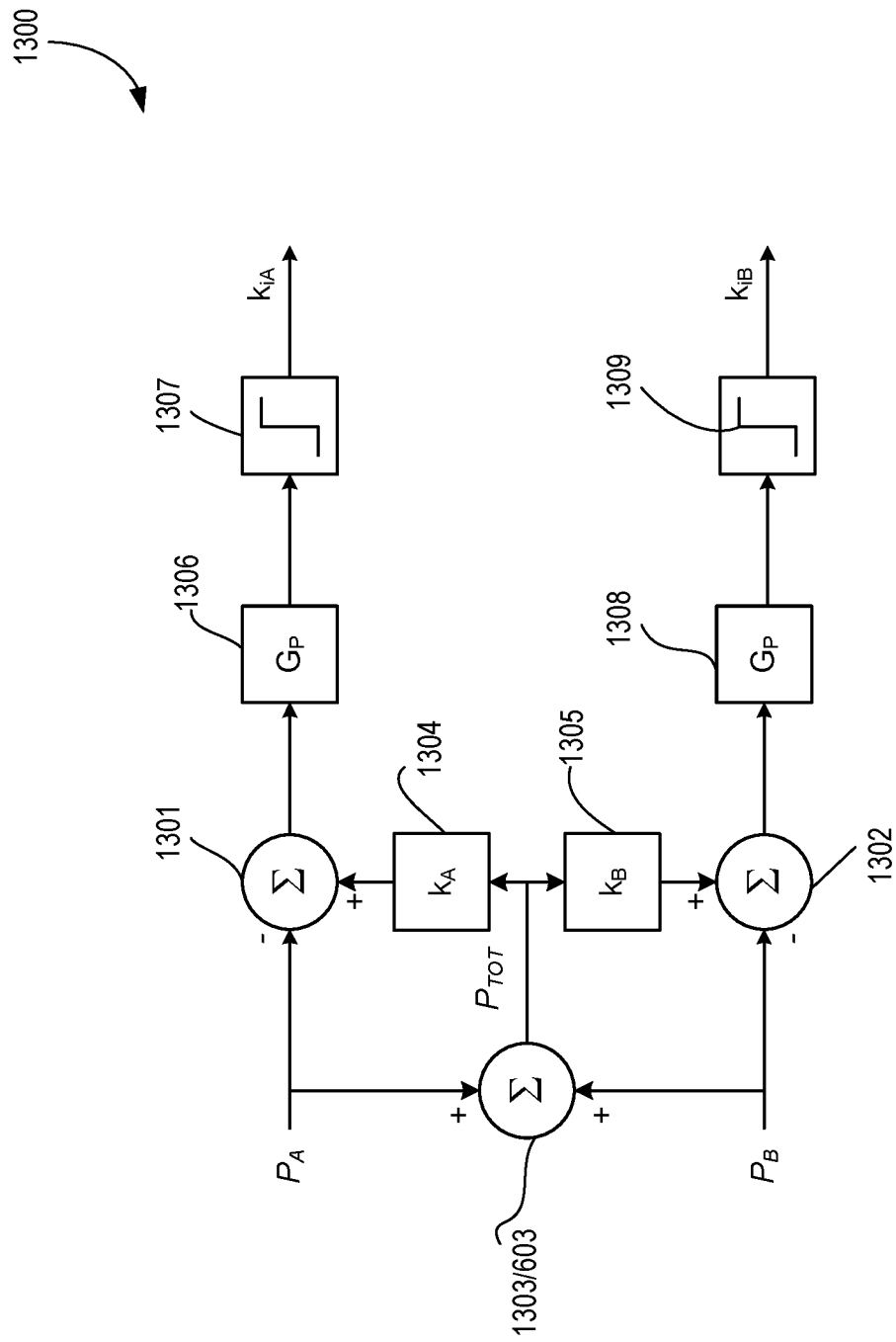
FIGS. 13, 14, 15A-B illustrate control blocks, respectively, with two input power balance loops for balancing input power from multiple sources, in accordance with some embodiments.
Figure 14:
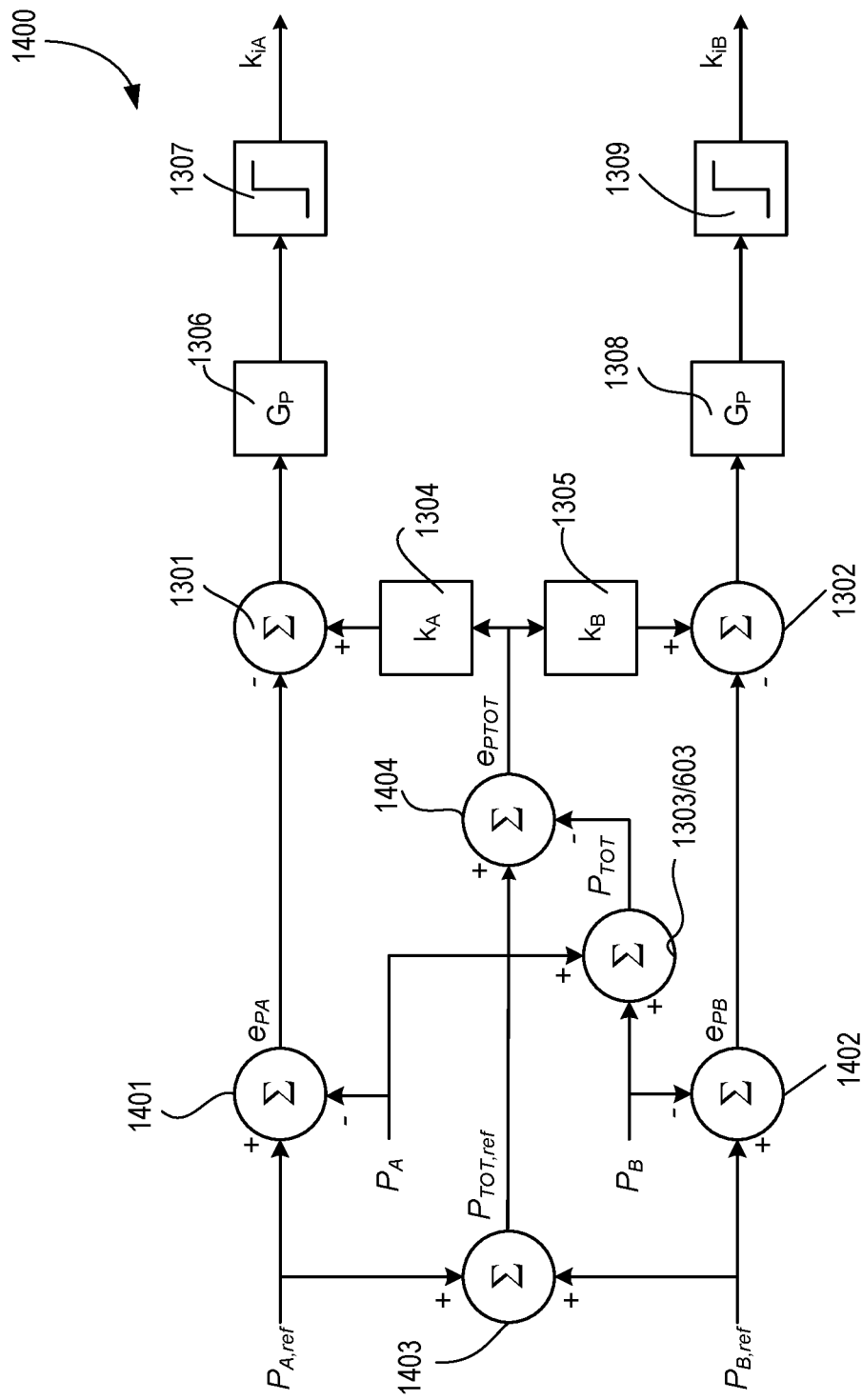

FIGS. 13, 14, and 15A and B illustrate control blocks 1300, 1400, and 1500, respectively, with two input power balance loops for balancing input power from multiple sources, in accordance with some embodiments. The control blocks 1300, 1400, and 1500 correspond to circuitry of input power balance 1002f and current balance 1003g. Here, two input power balance loops are described. The first loop is to balance the power proportional to the capability of the input power supply source (e.g., Vin,A and Vin,B). The second loop balances the available power for each input power supply source.

Control block 1300 comprises summation circuitries 1301, 1302, and 1303, scaling units 1304 and 1305, compensation networks 1306 and 1308, and safety limiters 1307 and 1309. P$_A$ and P$_B$ are the measured power drawn from input power supply rails Vin,A and Vin,B, respectively. P$_{TOT}$ is the total power or summation of power drawn from input power supply rails Vin,A and Vin,B. When P$_A$ hits its limit or is near its limit, then current is steered from input power supply rail Vin,A to Vin,B. Limiters 1307 and 1309 prevent saturation of current through inductors L$_1$ through L$_{Nph}$.

The measured total power P$_{TOT}$ is scaled for each individual source by k$_A$ or k$_B$ with the target power draw for each power source (e.g., power sources providing power to input power supply rails Vin,A and Vin,B). Power measured for each power source is compared to its target, and the result is compensated by G$_P$ to generate ki$_A$ and ki$_B$, where k$_{iA}$ and k$_{iB}$ are the current steering coefficients that are used in the current balancing loop.

Power balancing implemented in control block 1300 can be enabled to run at all times to constantly and continuously balance input power supplies. Alternatively, control block 1300 can be activated to operate under certain conditions. In some embodiments, control block 1300 can be activated when total power P$_{TOT}$ exceeds a limit. In some embodiments, control block 1300 can be activated to balance power when powers P$_A$ or P$_B$ exceed a limit related to the rated limit of the power source. The limits can be less than or equal to the rated limit of the power sources. The limits can be programmable.

Control block 1400 includes summation circuitries 1401, 1402, 1403, 1404 in addition to the ones described with reference to control block 1300. P$_{A,ref}$ and P$_{B,ref}$ are individual reference power limits on input power supply rails Vin,A and Vin,B. P$_{TOT,ref}$ is the total reference power limit. e$_{PA}$ is the error between the measured power P$_A$ and limit of Power Source P$_{A,ref}$. e$_{PB}$ is the error between the measured power P$_B$ and limit of Power Source P$_{B,ref}$. e$_{PTOT}$ is the error between the total measured power and the limit of the input power supply rails Vin,A and Vin,B (e.g., limit of the sources providing power to these rails). e$_{PTOT}$ is expressed as:

$$e_{PTOT} = (P_{A,ref} + P_{B,ref}) - (P_A + P_B)$$

The scaling terms k$_A$ and k$_B$ are expressed as:

$$k_A = \frac{P_{A,ref}}{P_{TOT,ref}}$$

$$k_B = \frac{P_{B,ref}}{P_{TOT,ref}}$$

Here, the current steering coefficients k$_{iA}$ and k$_{iB}$ are used in the current balancing loop. The total error e$_{PTOT}$ is scaled for each individual input power source by $k_A$ or $k_B$. Error of each input power source is compared to its target, and the result is compensated by $G_p$ to generate $ki_A$ and $ki_B$. The power balancing loop can operate in one of many configurations. For example, the power balance loop can be always enabled to run at all times to constantly and continuously balance input power supplies. The power balance loop can balance if one of the input sources exceeds its limit ($P_{ref}$). The power balance loop can balance if one of the input sources approaches limit (e.g., passes a threshold lower than the limit). The power balance loop can balance when scaled error ($e_{PTOT}*k_{A/B}$) approaches a threshold. The power balance loop can be used when a difference in scaled errors cross a threshold. The power balance loop can be used when the total load power (e.g., VR output power) exceeds a threshold.

Control loop 1500 illustrates the current balance loop. Here, $I_{ref}$ is the average of the total current supplied by the voltage regulator. Currents $I_1$, $I_2$, through $I_{Nph}$ are the measured currents of the individual VR phases. $k_{iA}$ and $k_{iB}$ scale the reference current, Gi is a compensation network.

Each measured phase current is compared to the augmented reference $(1+k_{iA/B})$ to create a phase-specific delta duty cycle and to steer the current between phases. Increasing current through a phase increases current (hence power) drawn from the supply rail it is connected to. Apparatus 1520 calculates the $I_{ref}$ signal required to equalize currents through the phases.

Assume source Vin,A has 75 Watt (W) limit and source Vin,B has 150 W limit for a total limit of 225 W. Assume that that the power drawn by the bridges is 210 W and the measured error for each input power source is 7.5 W. In the power balance loop (e.g., FIG. 13 and FIG. 14), the total error is scaled for each source. For example, source A target is $k_A*e_{PTOT}=(75\ W/225\ W)*15\ W=5\ W$, and source B target is $k_B*e_{PTOT}=(150\ W/225\ W)*15\ W=10\ W$. The difference between measured error and target error for each source is compensated by $G_P$ to generate $k_{iA}$ and $k_{iB}$. In the current balance loop (e.g., FIGS. 15A-B), $k_{iA}$ and $k_{iB}$ augments reference to increase/decrease duty cycles of the PWM signal of each phase to draw more/less power for each input power source. FIGS. 15 A-B also show the internals of current balance 1002g.

While the various embodiments show linear control loop to implement power balance scaled to the limits of the input sources, other schemes can also be used. For example, a scheme can be used for not balancing the error. In one case, an input power source is allowed to be drawn at its limit and phases are scaled up on the other input power source(s) to force them to draw more power. This scheme effectively clamps one source at its limit and allows the other source to provide more until it also hits its limit. In this scheme, one supply is clamped so other supplies are forced to increase until they also reach their limit. In another scheme, an input power source is allowed to be drawn at its limit and then current is provided by the supported phases is reduced. This scheme forces all phases (e.g., phases connected to supplies Vin,A and Vin,B) to increase together until they both reach their limits.

In some embodiments, instead of a continuous linear compensation network, discrete threshold are implemented. Thresholds can be for individual input powers, sum of input powers, or difference between input powers. Crossing a threshold results in some predefined $k_{iA/B}$ value being used in the current balance loop. For example, if $P_A-P_B$ is greater than 50, then $k_{iA}=0.995$ and $k_{iB}$ is 1.025. If the power drawn from input power source A is more than 50 W greater than input power source B, the current through the phases on source A are scaled down by 0.5%, and the current through phases on source B are scaled up by 2.5%.

In some VR designs, some phases run hotter than others due to non-uniform cooling of thermal solution or proximity heating effects (e.g., middle phases run hotter than peripheral phases). Phase current steering is identified on datasheets as a static means of overcoming non-uniform phase heating. The scheme can be extended to thermal balancing input power balancing loop. For example, input power is balanced by steering current and thermals are balanced with further steering of current.

Figure 16:
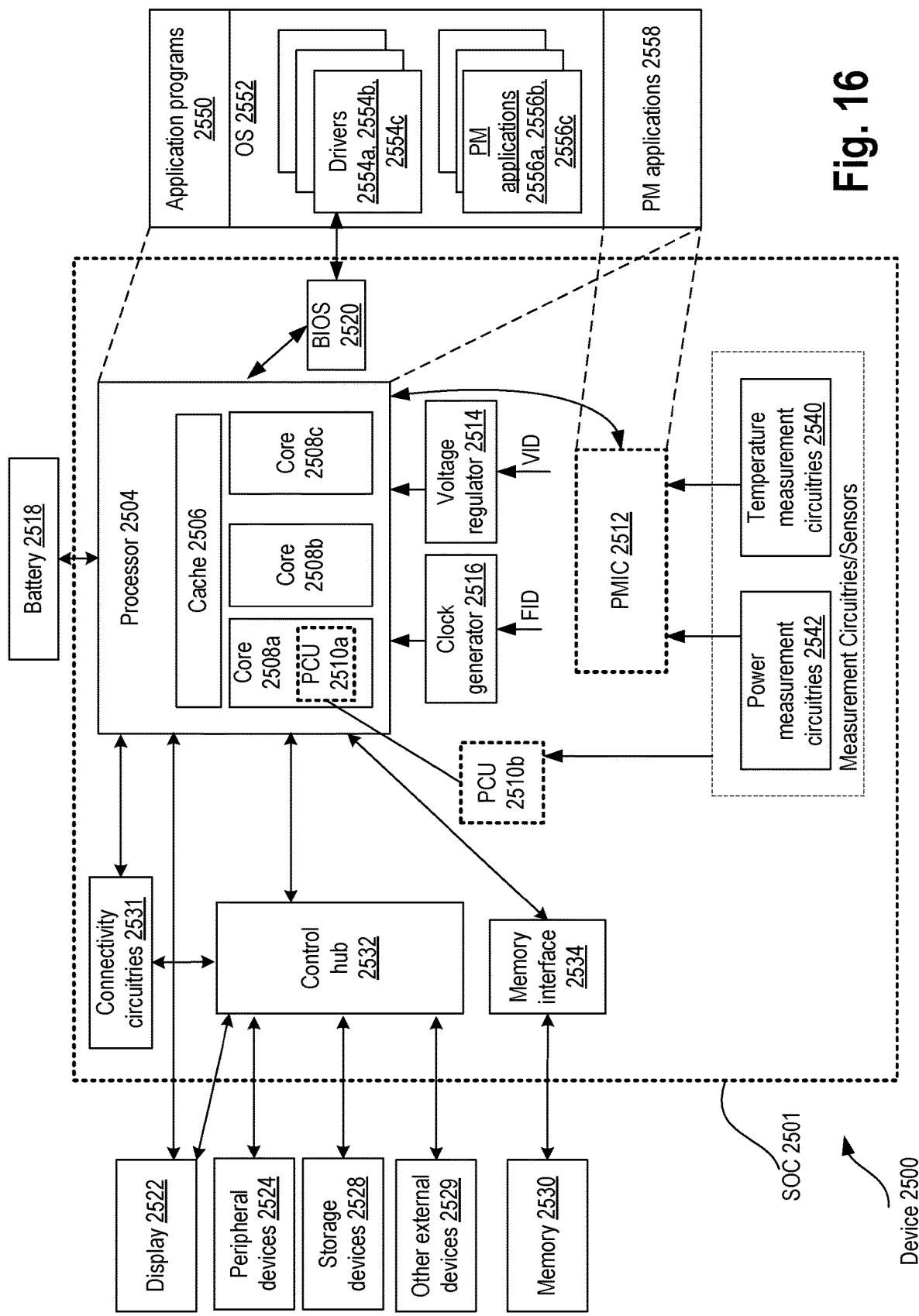
FIG. 16 illustrates a smart device, or a computer system, or a SoC (System-on-Chip) that uses the apparatus for balancing input power from multiple sources, according to some embodiments of the disclosure.

FIG. 16 illustrates a smart device, or a computer system, or a SoC (System-on-Chip) 103/2500 that uses the apparatus for balancing input power from multiple sources, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here the logic to analyze the sensed, measured, or estimated sense signals (power, current, and/or voltage) and generate control signals for switches to move the phases or bridges from one power supply rail to another power supply rail to balance the power drawn from the input power supply rails. In some embodiments, the voltage regulator(s) of the SoC may also steer current through the phases or bridges to balance the power drawn from the input power supply rails. For example, the VR(s) may adjust the duty cycle of PWM signals to change the current driven or sunk from high-side and/or low-side switches of the phases or bridges.

In an example, the device 2500 comprises a SoC (System-on-Chip) 2501. An example boundary of the SOC 2501 is illustrated using dotted lines in FIG. 16, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508*a*, a second section of cache 2506 dedicated to core 2508*b*, and so on). In an example, one or more sections of cache 2506 may be shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions may be fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508a, 2508b, 2508c, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510a/b and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510a. In an example, some other sections of PCU 2510 may be implemented outside the processing cores 2508, and these sections of PCU 2510 are symbolically illustrated using a dotted box and labelled as PCU 2510b. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556a, 2556b, 2556c. The OS 2552 may also include various drivers 2554a, 2554b, 2554c, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a first power supply rail to provide a first power supply as input to a first set of bridges, wherein the first set of bridges is coupled to a first set of inductors; a second power supply rail to provide a second power supply as input to a second set of bridges, wherein the second set of bridges is coupled to a second set of inductors; and a controller to monitor electrical characteristics associated with the first and second power supply rails, and to control one or more switches to substantially balance power received by the first and second set of bridges, wherein the one or more switches are coupled to the first and second bridges and the first and second power supply rails.

Example 2: The apparatus of example 1, wherein an individual bridge of the first set of bridges is to provide a first phase to a load, wherein an individual bridge of the second set of bridges is to provide a second phase to the load, and wherein the first phase is different from the second phase.

Example 3: The apparatus of example 2, wherein the load is a system-on-chip.

Example 4: The apparatus of example 1, wherein the controller is to close the one or more switches to move a phase of a bridge of the first set of bridges to the second set of bridges if the second set of bridges demands less power from the second power supply rail than the first set of bridges demand from the first power supply rail.

Example 5: The apparatus of example 1, wherein the controller is to adjust a duty cycle of a drive signal to each bridge of the first and/or second set of bridges to introduce current inequality between the bridges.

Example 6: The method of example 5, wherein the current inequality between the first and second set of bridges is introduced in response to measured input power.

Example 7: The method of example 5, wherein the current inequality between the first and second set of bridges is introduced in response to measured input current.

Example 8: The apparatus of example 1, wherein the controller comprises: a first analog-to-digital converter coupled to a first resistor between the first power supply rail and the first set of bridges, wherein the first analog-to-digital converter is to receive a first voltage of the first power supply rail and a first current through the first power supply rail towards the first set of bridges.

Example 9: The apparatus of example 8, wherein the controller comprises: a second analog-to-digital converter coupled to a second resistor between the second power supply rail and the second set of bridges, wherein the second analog-to-digital converter is to receive a second voltage of the first power supply rail and a second current through the second power supply rail towards the second set of bridges.

Example 10: The apparatus of example 1 comprises: a first power sensor to measure first power through the first power supply rail; and a second power sensor to measure second power through the second power supply rail.

Example 11: The apparatus of example 10, wherein the controller comprises: a first analog-to-digital converter coupled to an output of the first power sensor, wherein the first analog-to-digital converter is to convert the first measured power to a digital representation of the measured power; and a second analog-to-digital converter coupled to an output of the second power sensor, wherein the second analog-to-digital converter is to convert the second measured power to a digital representation of the measured power.

Example 12: The apparatus of example 10 comprises a node to sum the measured first and second powers, and provide the sum to the controller.

Example 13: The apparatus of example 10 comprises: a first comparator to compare the first measured power with a first reference power; and a second comparator to compare the second measured power to a second reference power; and an OR gate to perform an OR logic function with outputs of the first and second comparators, wherein an output of the OR gate is provided to a load.

Example 14: An apparatus comprising: a first power supply rail to provide a first power supply as input to a first set of bridges, wherein the first set of bridges is coupled to a first set of inductors; a second power supply rail to provide a second power supply as input to a second set of bridges, wherein the second set of bridges is coupled to a second set of inductors; and a controller to balance power drawn from the first and second power supply rails via: a coarse adjustment of one or more phases of the first and second set of bridges; and a fine adjust of current through the one or more phases of the first and second set of bridges.

Example 15: The apparatus of example 14, wherein the controller is to monitor electrical characteristics associated with the first and second power supply rails.

Example 16: The apparatus of example 15, wherein the electrical characteristics include one or more of current through the first and second power supply rails, or power associated with the first and second power supply rails.

Example 17: The apparatus of example 14, wherein the controller is to control one or more switches for the coarse adjustment to substantially balance power received by the first and second set of bridges, wherein the one or more switches are coupled to the first and second bridges and the first and second power supply rails.

Example 18: The apparatus of example 12, wherein the controller is to adjust a duty cycle of a drive signal to each bridge of the first and/or second set of bridges to introduce current inequality between the bridges, wherein the current inequality between the first and second set of bridges is introduced in response to measured input power; or wherein the current inequality between the first and second set of bridges is introduced in response to measured input current.

Example 19: A system comprising: a first set of inductors; a first power supply rail to provide a first power supply as input to a first set of bridges, wherein the first set of bridges is coupled to the first set of inductors; a second set of inductors; a second power supply rail to provide a second power supply as input to a second set of bridges, wherein the second set of bridges is coupled to the second set of inductors; and a system-on-chip coupled to the first and second set of inductors; one or more switches are coupled to the first and second bridges and the first and second power supply rails; a voltage regulator (VR) controller to monitor electrical characteristics associated with the first and second power supply rails, and to dynamically control the one or more switches to substantially balance power received by the first and second set of bridges.

Example 20: The system of example 19, wherein the VR controller is to close the one or more switches to move a phase of a bridge of the first set of bridges to the second set of bridges if the second set of bridges demands less power from the second power supply rail than the first set of bridges demand from the first power supply rail.

Example 21: The system of example 19, wherein the VR controller is to adjust a duty cycle of a drive signal to each bridge of the first and/or second set of bridges to balance current flow through the bridge.

Example 22: The system of example 19, wherein an individual bridge of the first set of bridges is to provide a first phase to a load, wherein an individual bridge of the second set of bridges is to provide a second phase to the load, and wherein the first phase is different from the second phase.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first power supply rail to provide a first power supply as input to a first set of bridges, wherein the first set of bridges is coupled to a first set of inductors;
   a second power supply rail to provide a second power supply as input to a second set of bridges, wherein the second set of bridges is coupled to a second set of inductors; and
   a controller to monitor electrical characteristics associated with the first and second power supply rails, and to control one or more switches to substantially balance power received by the first and second set of bridges, wherein the one or more switches are coupled to the first and second bridges and the first and second power supply rails, and wherein the controller is to close the one or more switches to move a phase of a bridge of the first set of bridges to the second set of bridges if the second set of bridges demands less power from the second power supply rail than the first set of bridges demand from the first power supply rail.

2. The apparatus of claim 1, wherein an individual bridge of the first set of bridges is to provide a first phase to a load, wherein an individual bridge of the second set of bridges is to provide a second phase to the load, and wherein the first phase is different from the second phase.

3. The apparatus of claim 2, wherein the load is a system-on-chip.

4. The apparatus of claim 1, wherein the controller is to adjust a duty cycle of a drive signal to each bridge of the first and/or second set of bridges to introduce current inequality between the bridges.

5. The apparatus of claim 4, wherein the current inequality between the first and second set of bridges is introduced in response to measured input power.

6. The apparatus 1, wherein the controller comprises:
   a first analog-to-digital converter coupled to a first resistor between the first power supply rail and the first set of bridges, wherein the first analog-to-digital converter is to receive a first voltage of the first power supply rail and a first current through the first power supply rail towards the first set of bridges.

7. The apparatus of claim 6, wherein the controller further comprises:
   a second analog-to-digital converter coupled to a second resistor between the second power supply rail and the second set of bridges, wherein the second analog-to-digital converter is to receive a second voltage of the first power supply rail and a second current through the second power supply rail towards the second set of bridges.

8. The apparatus of claim 1, further comprising:
   a first power sensor to measure a first power through the first power supply rail; and
   a second power sensor to measure a second power through the second power supply rail.

9. The apparatus of claim 8, wherein the controller comprises:
   a first analog-to-digital converter coupled to an output of the first power sensor, wherein the first analog-to-digital converter is to convert the measured first power to a first digital representation of the measured first power; and a second analog-to-digital converter coupled to an output of the second power sensor, wherein the second analog-to-digital converter is to convert the measured second power to a second digital representation of the measured second power.

10. The apparatus of claim 8, further comprising a node to sum the measured first and second powers, and provide the sum to the controller.

11. The apparatus of claim 8, further comprising:
a first comparator to compare the measured first power with a first reference power;
a second comparator to compare the measured second power to a second reference power; and
an OR gate to perform an OR logic function with outputs of the first and second comparators, wherein an output of the OR gate is provided to a load.

12. A system comprising:
a first set of inductors;
a first power supply rail to provide a first power supply as input to a first set of bridges, wherein the first set of bridges is coupled to the first set of inductors;
a second set of inductors;
a second power supply rail to provide a second power supply as input to a second set of bridges, wherein the second set of bridges is coupled to the second set of inductors;
a system-on-chip coupled to the first and second set of inductors;
one or more switches are coupled to the first and second set of bridges and the first and second power supply rails; and
a voltage regulator (VR) controller to monitor electrical characteristics associated with the first and second power supply rails, and to dynamically control the one or more switches to substantially balance power received by the first and second set of bridges, wherein the VR controller is to close the one or more switches to move a phase of a bridge of the first set of bridges to the second set of bridges if the second set of bridges demands less power from the second power supply rail than the first set of bridges demand from the first power supply rail.

13. The system of claim 12, wherein the VR controller is to adjust a duty cycle of a drive signal to each bridge of the first and/or second set of bridges to balance current flow through the bridge.

14. The system of claim 12, wherein an individual bridge of the first set of bridges is to provide a first phase to a load, wherein an individual bridge of the second set of bridges is to provide a second phase to the load, and wherein the first phase is different from the second phase.

15. An apparatus comprising:
a first power supply rail to provide a first power supply as input to a first set of bridges, wherein the first set of bridges is coupled to a first set of inductors;
a second power supply rail to provide a second power supply as input to a second set of bridges, wherein the second set of bridges is coupled to a second set of inductors;
a controller to monitor electrical characteristics associated with the first and second power supply rails, and to control one or more switches to substantially balance power received by the first and second set of bridges, wherein the one or more switches are coupled to the first and second bridges and the first and second power supply rails;
a first power sensor to measure a first power through the first power supply rail;
a second power sensor to measure a second power through the second power supply rail; and
a node to sum the measured first and second powers, and provide the sum to the controller.

16. The apparatus of claim 15, wherein an individual bridge of the first set of bridges is to provide a first phase to a load, wherein an individual bridge of the second set of bridges is to provide a second phase to the load, and wherein the first phase is different from the second phase.

17. The apparatus of claim 16, wherein the load is a system-on-chip.

18. The apparatus 15, wherein the controller comprises:
a first analog-to-digital converter coupled to a first resistor between the first power supply rail and the first set of bridges, wherein the first analog-to-digital converter is to receive a first voltage of the first power supply rail and a first current through the first power supply rail towards the first set of bridges.

19. The apparatus of claim 18, wherein the controller further comprises:
a second analog-to-digital converter coupled to a second resistor between the second power supply rail and the second set of bridges, wherein the second analog-to-digital converter is to receive a second voltage of the first power supply rail and a second current through the second power supply rail towards the second set of bridges.

20. An apparatus comprising:
a first power supply rail to provide a first power supply as input to a first set of bridges, wherein the first set of bridges is coupled to a first set of inductors;
a second power supply rail to provide a second power supply as input to a second set of bridges, wherein the second set of bridges is coupled to a second set of inductors;
a controller to monitor electrical characteristics associated with the first and second power supply rails, and to control one or more switches to substantially balance power received by the first and second set of bridges, wherein the one or more switches are coupled to the first and second bridges and the first and second power supply rails;
a first power sensor to measure a first power through the first power supply rail;
a second power sensor to measure a second power through the second power supply rail;
a first comparator to compare the measured first power with a first reference power;
a second comparator to compare the measured second power to a second reference power; and
an OR gate to perform an OR logic function with outputs of the first and second comparators, wherein an output of the OR gate is provided to a load.

21. The apparatus of claim 20, wherein an individual bridge of the first set of bridges is to provide a first phase to a load, wherein an individual bridge of the second set of bridges is to provide a second phase to the load, and wherein the first phase is different from the second phase.

22. The apparatus of claim 21, wherein the load is a system-on-chip.

23. The apparatus 20, wherein the controller comprises:
a first analog-to-digital converter coupled to a first resistor between the first power supply rail and the first set of bridges, wherein the first analog-to-digital converter is to receive a first voltage of the first power supply rail and a first current through the first power supply rail towards the first set of bridges.

24. The apparatus of claim 23, wherein the controller further comprises:
a second analog-to-digital converter coupled to a second resistor between the second power supply rail and the second set of bridges, wherein the second analog-to-digital converter is to receive a second voltage of the first power supply rail and a second current through the second power supply rail towards the second set of bridges.

* * * * *